(12) United States Patent
Wengert et al.

(10) Patent No.: US 6,464,792 B1
(45) Date of Patent: *Oct. 15, 2002

(54) PROCESS CHAMBER WITH DOWNSTREAM GETTER PLATE

(75) Inventors: John F. Wengert, Phoenix; Loren R. Jacobs, Mesa; Michael W. Halpin, Phoenix; Derrick W. Foster, Scottsdale; Cornelius A. van der Jeugd; Robert M. Vyne, both of Tempe; Mark R. Hawkins, Gilbert, all of AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/613,437

(22) Filed: Jul. 11, 2000

Related U.S. Application Data

(60) Division of application No. 08/637,616, filed on Apr. 25, 1996, now Pat. No. 6,093,252, which is a continuation-in-part of application No. 08/549,461, filed on Oct. 27, 1995, now abandoned.

(60) Provisional application No. 60/001,863, filed on Aug. 3, 1995.

(51) Int. Cl.$^7$ .............................................. C23C 16/00
(52) U.S. Cl. ..................... 118/715; 118/724; 118/725; 427/248.1
(58) Field of Search ................................. 118/715, 725, 118/724; 427/69, 70, 527, 568, 585–593, 248.1

(56) References Cited

U.S. PATENT DOCUMENTS

| | | |
|---|---|---|
| 3,560,166 A | 2/1971 | Walles |
| 3,598,082 A | 8/1971 | Rice |
| 3,627,590 A | 12/1971 | Mammel |

(List continued on next page.)

FOREIGN PATENT DOCUMENTS

| | | | |
|---|---|---|---|
| EP | 0 605 725 A1 | | 7/1994 |
| FR | 2763964 | * | 12/1998 |
| JP | 57-198620 | | 6/1981 |
| JP | 59-112614 | | 6/1984 |
| JP | 59223294 | | 12/1984 |
| JP | 59-223294 | | 12/1984 |
| JP | 61-53197 | * | 7/1986 |

*Primary Examiner*—Jeffrie R. Lund
(74) *Attorney, Agent, or Firm*—Knobbe, Martens, Olson & Bear, LLP

(57) ABSTRACT

An improved chemical vapor deposition reaction chamber having an internal support plate to enable reduced pressure processing. The chamber has a vertical-lateral lenticular cross-section with a wide horizontal dimension and a shorter vertical dimension between bi-convex upper and lower walls. A central horizontal support plate is provided between two lateral side rails of the chamber. A large rounded rectangular aperture is formed in the support plate for positioning a rotatable susceptor on which a wafer is placed. The shaft of the susceptor extends downward through the aperture and through a lower tube depending from the chamber. The support plate segregates the reaction chamber into an upper region and a lower region, with purge gas being introduced through the lower tube into the lower region to prevent unwanted deposition therein. A temperature compensation ring is provided surrounding the susceptor and supported by fingers connected to the support plate. The temperature compensation ring may be circular or may be built out to conform to the rounded rectangular shape of the support plate aperture. The ring may extend farther downstream from the susceptor than upstream. A separate sacrificial quartz plate may be provided between the circular temperature compensation ring and the rounded rectangular aperture. The quartz plate may have a horizontal portion and a vertical lip in close abutment with the aperture to prevent devitrification of the support plate. A gas injector abuts an inlet flange of the chamber and injects process gas into the upper region and purge gas into the lower region. The gas injector includes a plurality of independently controlled channels disposed laterally across the chamber, the channels merging at an outlet of the injector to allow mixing of the adjacent longitudinal edges of the separate flows well before reaching the wafer.

8 Claims, 26 Drawing Sheets

U.S. PATENT DOCUMENTS

| | | | |
|---|---|---|---|
| 3,744,964 A | 7/1973 | Hart | |
| 3,830,194 A | 8/1974 | Benzing et al. | |
| 3,956,860 A | 5/1976 | Andrews | |
| 4,076,859 A | 2/1978 | Schladitz | |
| 4,108,108 A | 8/1978 | Schladitz | |
| 4,188,519 A | 2/1980 | Berg | |
| 4,512,283 A | 4/1985 | Bonifield et al. | |
| 4,533,820 A | 8/1985 | Shimizu | |
| 4,539,933 A | 9/1985 | Campbell et al. | |
| 4,545,327 A | 10/1985 | Campbell et al. | |
| 4,590,024 A | 5/1986 | Lesk et al. | |
| 4,770,630 A | 9/1988 | Akimoto et al. | |
| 4,803,948 A | 2/1989 | Nakagawa et al. | |
| 4,807,562 A | 2/1989 | Sandys | |
| 4,821,674 A | 4/1989 | deBoer et al. | |
| 4,828,224 A * | 5/1989 | Crabb et al. | 251/298 |
| 4,836,138 A | 6/1989 | Robinson et al. | |
| 4,839,145 A | 6/1989 | Gale et al. | |
| 4,854,263 A | 8/1989 | Chang et al. | |
| 4,886,449 A | 12/1989 | Brittin | |
| 4,920,918 A | 5/1990 | Adams et al. | |
| 4,924,807 A | 5/1990 | Nakayama et al. | |
| 4,958,061 A | 9/1990 | Wakabayashi et al. | |
| 4,980,204 A | 12/1990 | Fujii | |
| 4,991,540 A | 2/1991 | Jurgensen et al. | |
| 4,992,303 A | 2/1991 | Whiffin et al. | |
| 4,993,360 A | 2/1991 | Nakamura | |
| 4,994,301 A | 2/1991 | Kusumoto et al. | |
| 5,024,182 A | 6/1991 | Kobayashi et al. | |
| 5,038,395 A | 8/1991 | Lenski | |
| 5,062,386 A | 11/1991 | Christensen | |
| 5,070,814 A | 12/1991 | Whiffin et al. | |
| 5,077,875 A | 1/1992 | Hoke et al. | |
| 5,085,887 A | 2/1992 | Adams et al. | |
| 5,091,219 A | 2/1992 | Monkowski et al. | |
| 5,092,728 A | 3/1992 | Crabb et al. | |
| 5,096,534 A | 3/1992 | Ozias | |
| 5,108,792 A | 4/1992 | Anderson et al. | |
| 5,179,677 A | 1/1993 | Anderson et al. | |
| 5,228,917 A | 7/1993 | Pawlakowitsch et al. | |
| 5,292,554 A | 3/1994 | Sinha et al. | |
| 5,328,722 A | 7/1994 | Ghanayem et al. | |
| 5,336,327 A | 8/1994 | Lee | |
| 5,348,587 A | 9/1994 | Eichman et al. | |
| 5,370,736 A | 12/1994 | Roy et al. | |
| 5,370,738 A | 12/1994 | Watanabe | |
| 5,411,590 A | 5/1995 | Hawkins et al. | |
| 5,421,401 A * | 6/1995 | Sherstinsky et al. | 165/80.2 |
| 5,421,893 A | 6/1995 | Perlov | |
| 5,421,957 A | 6/1995 | Carlson et al. | |
| 5,455,069 A | 10/1995 | Lee | |
| 5,520,742 A * | 5/1996 | Ohkase | 118/724 |
| 5,551,982 A | 9/1996 | Anderson | |
| 5,685,906 A | 11/1997 | Dietze | |
| 6,093,252 A * | 7/2000 | Wengert et al. | 118/719 |
| 6,190,457 B1 * | 2/2001 | Arai et al. | 118/715 |
| 6,325,858 B1 * | 12/2001 | Wenger et al. | 118/725 |
| 6,343,183 B1 * | 1/2002 | Halpin et al. | 392/416 |
| 2002/0011211 A1 * | 1/2002 | Halpin | 118/715 |

* cited by examiner

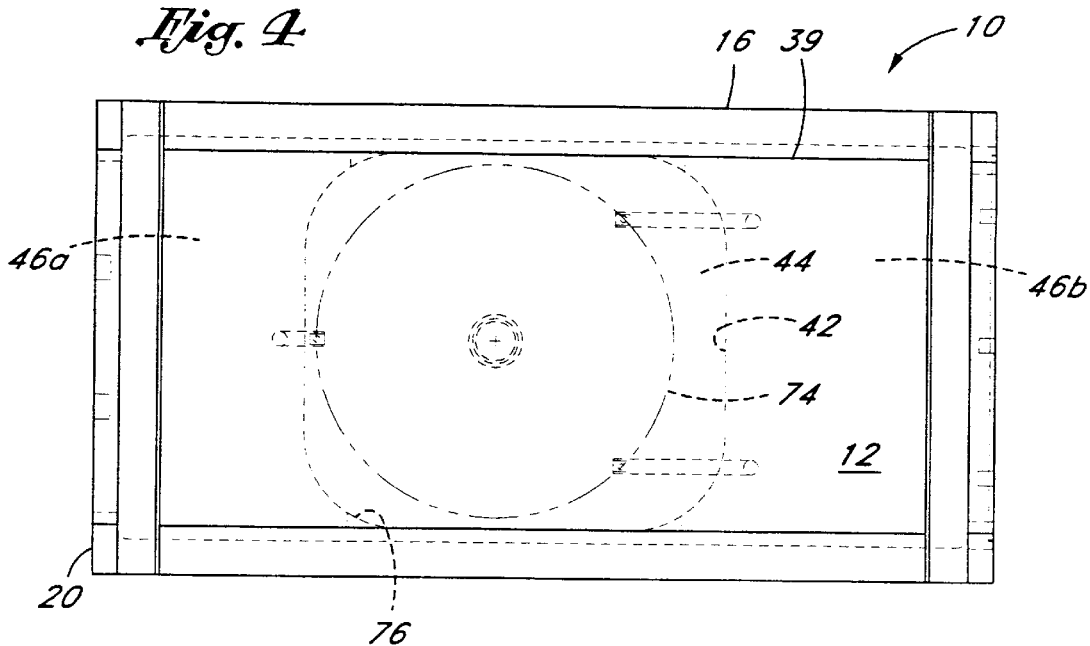
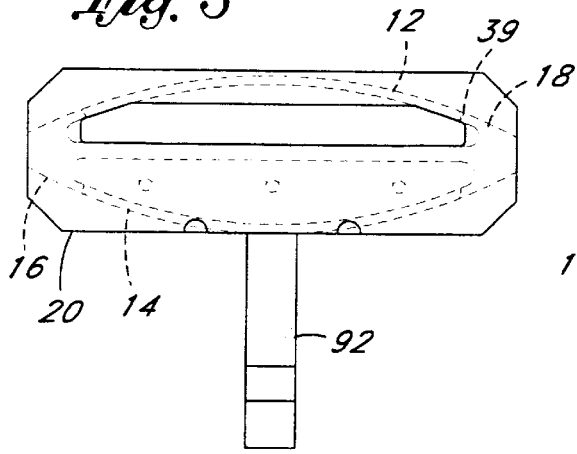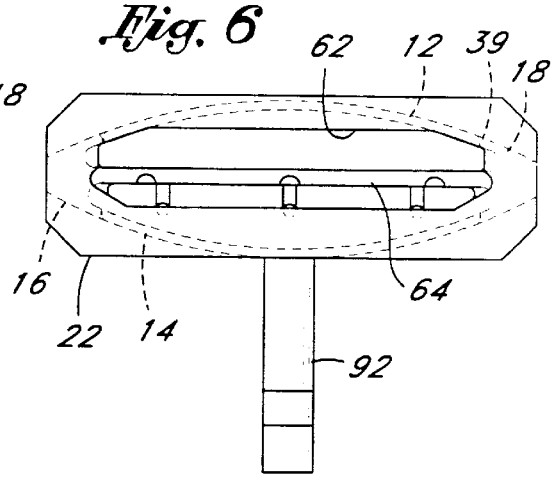
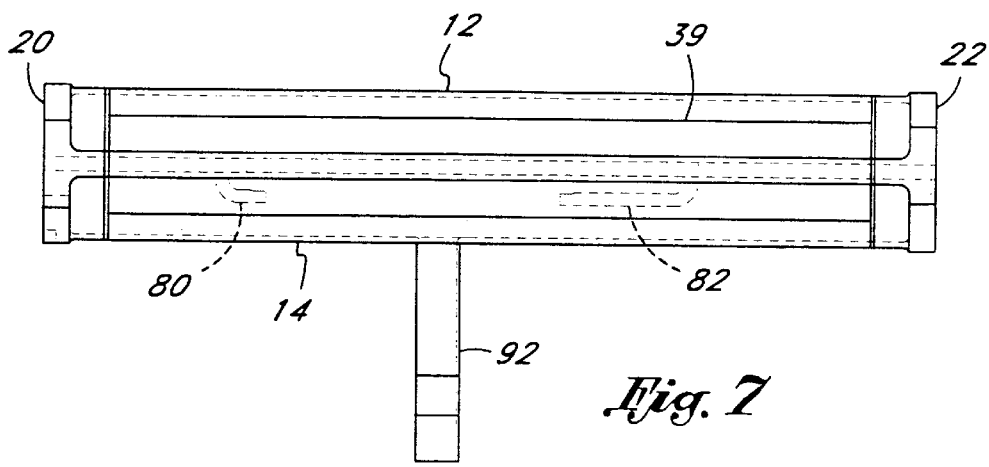

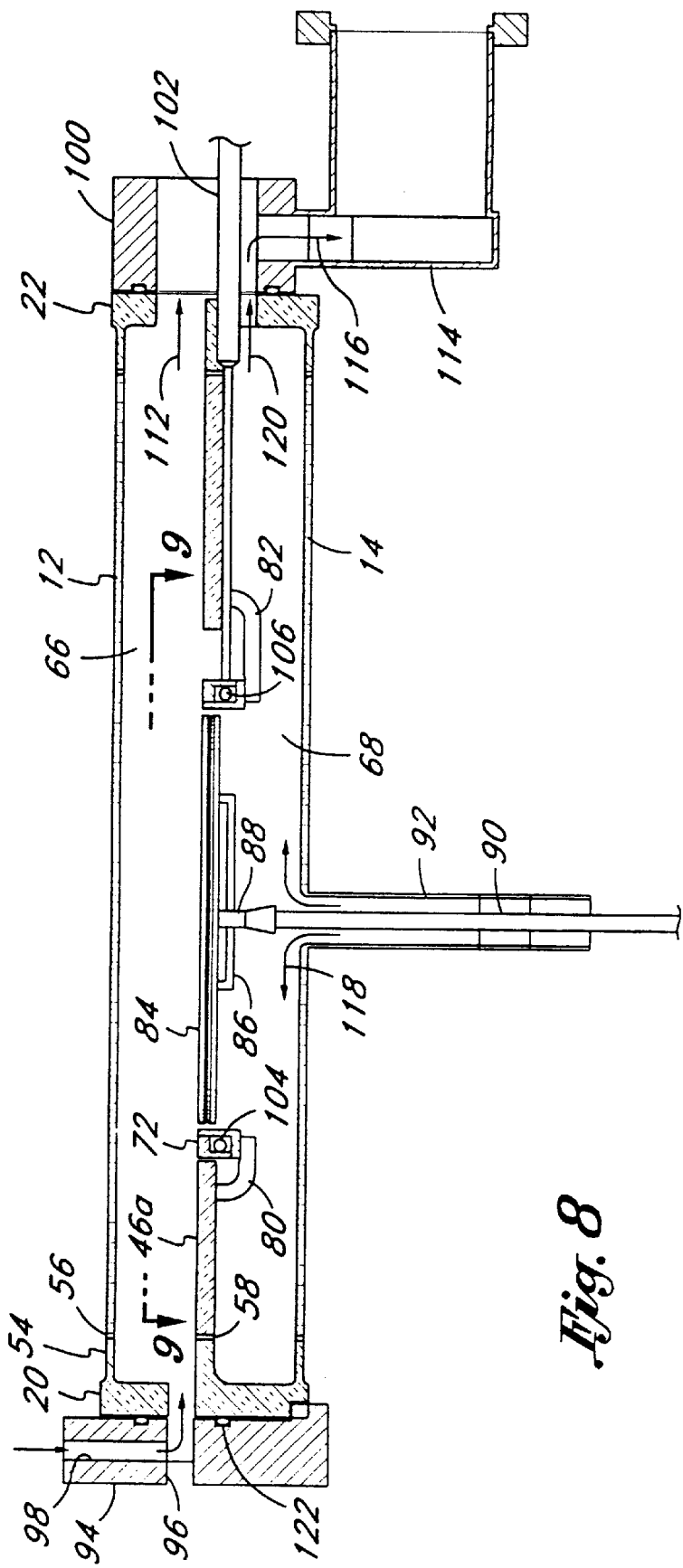

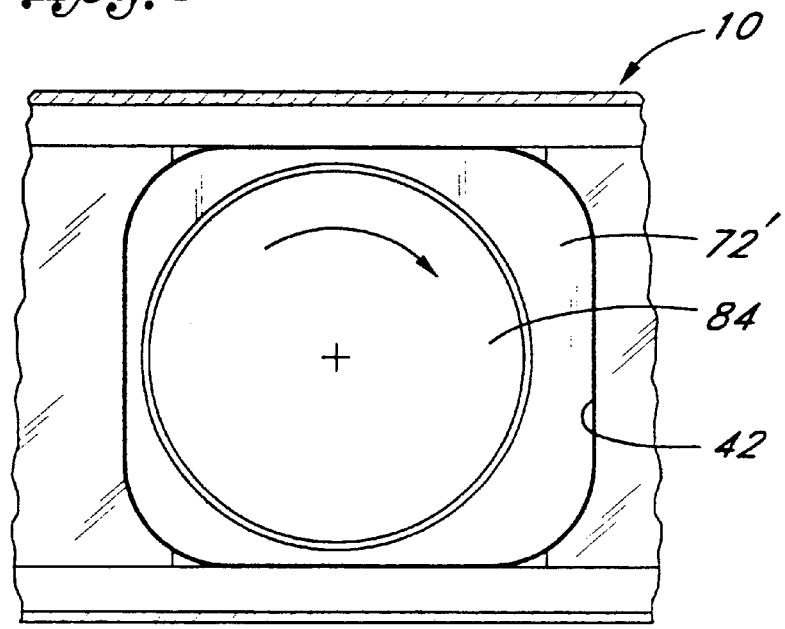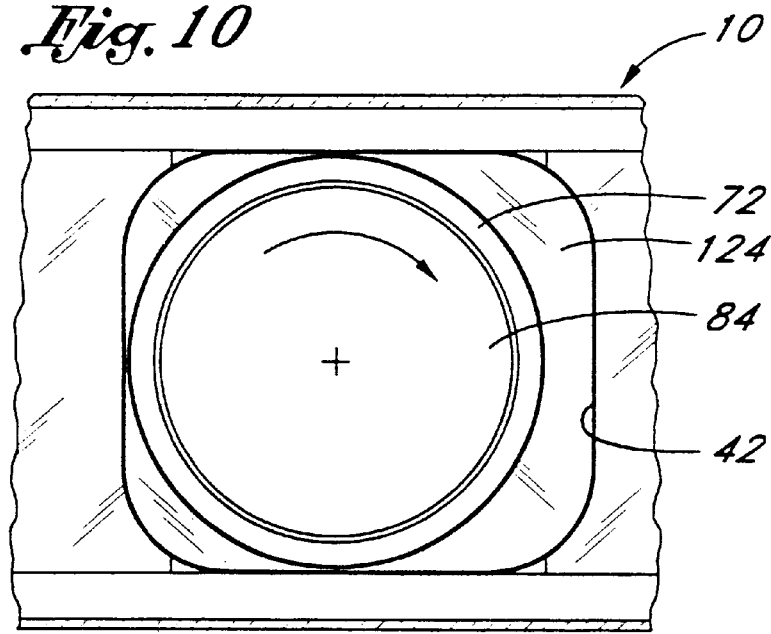

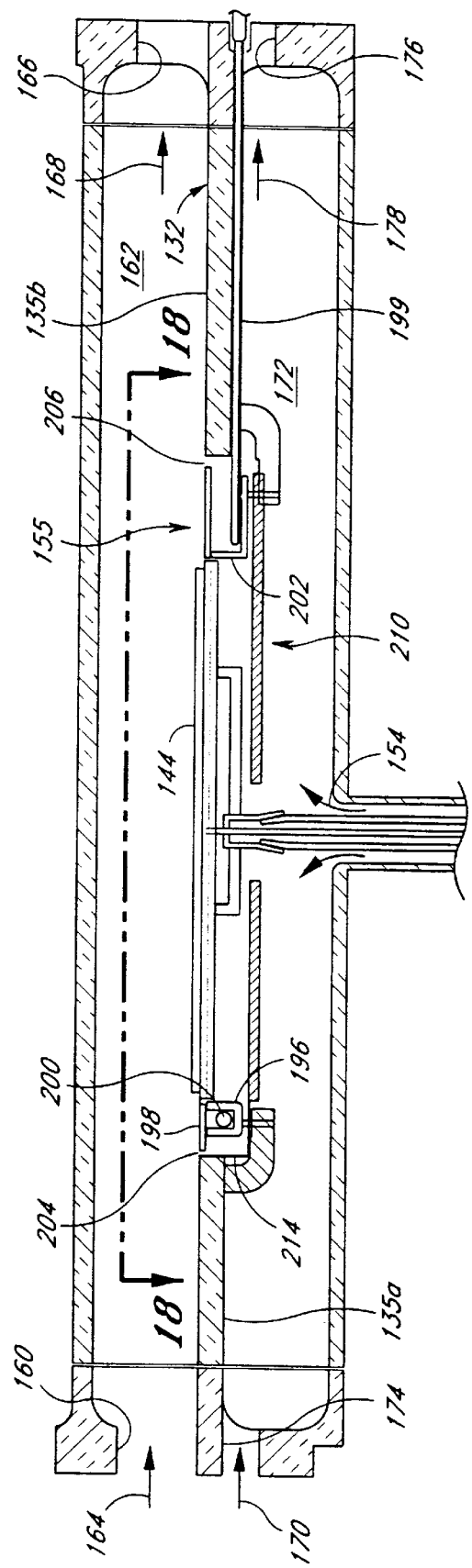

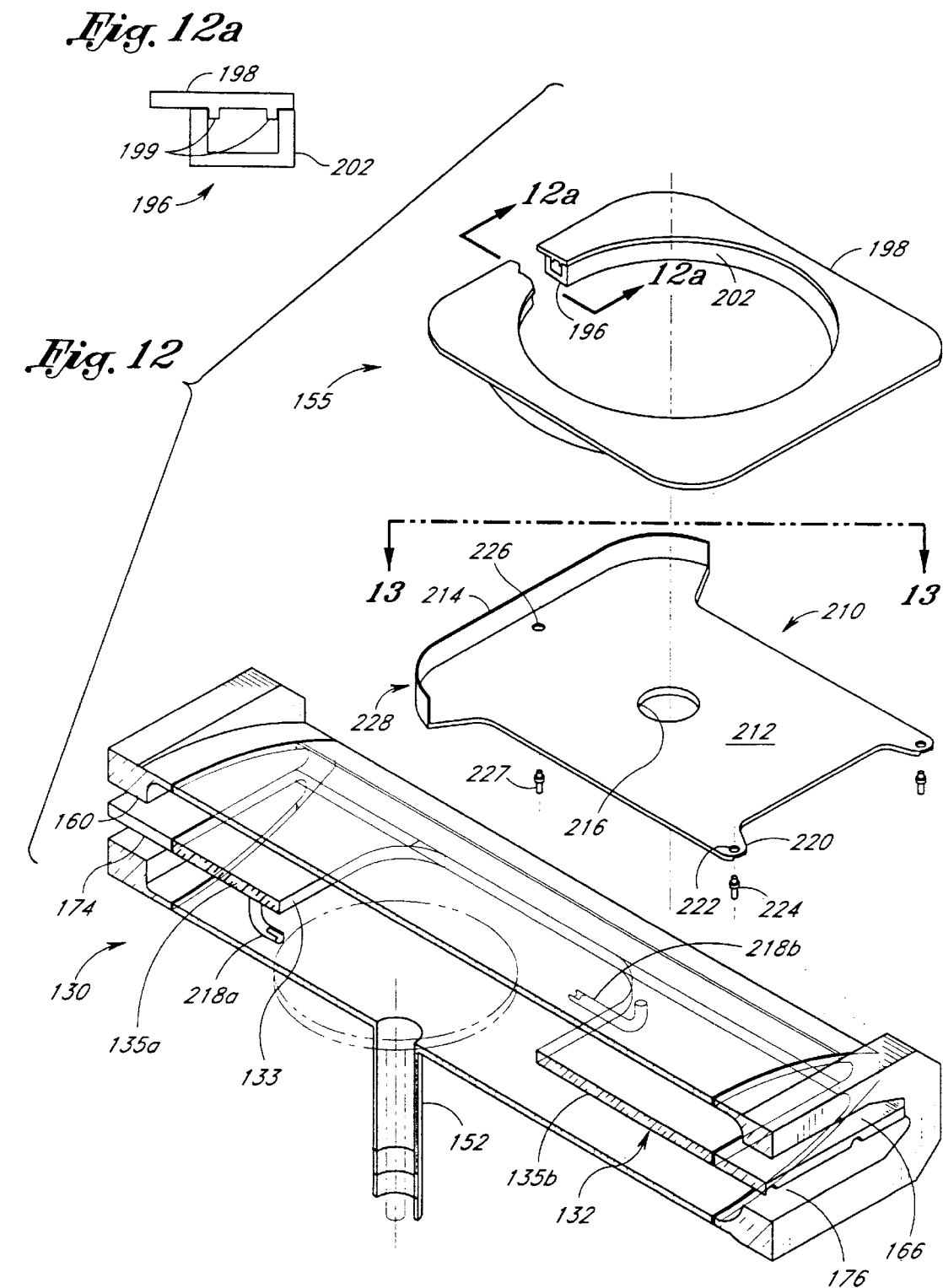

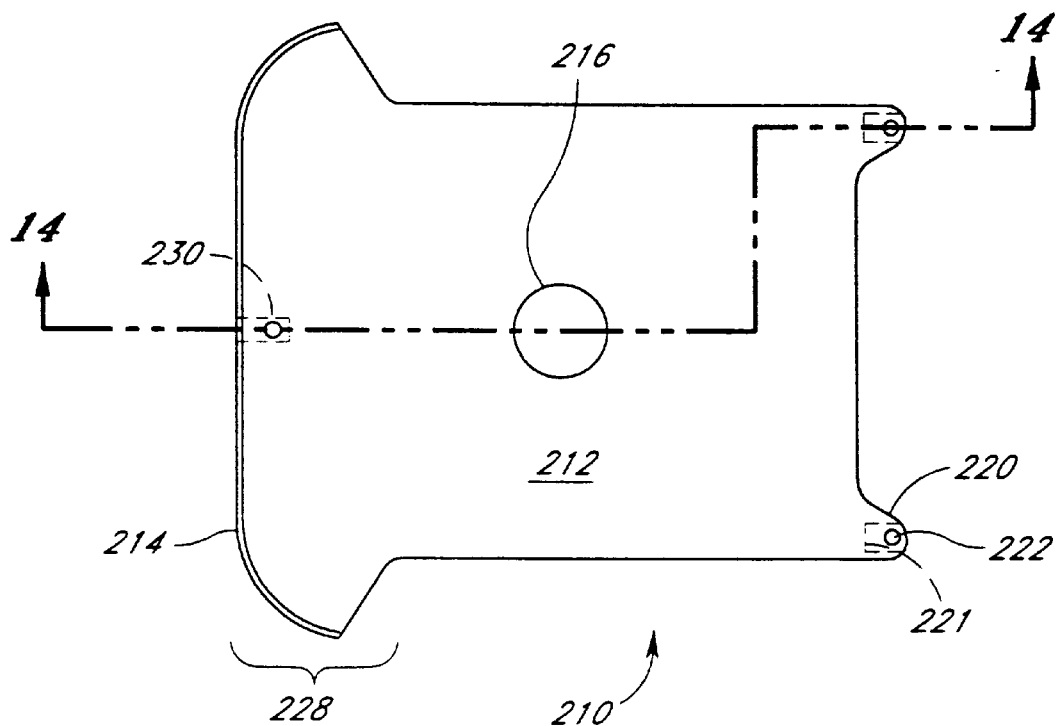
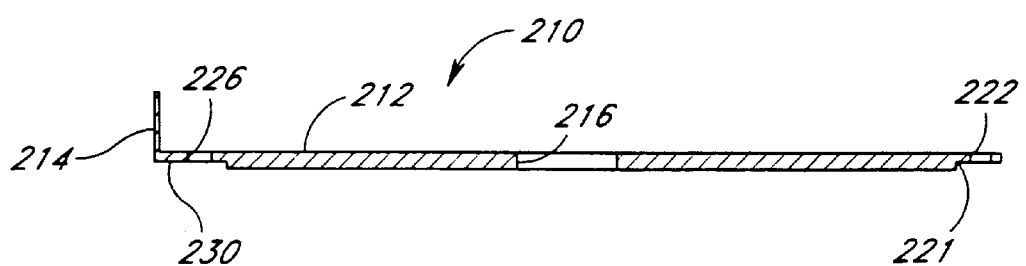

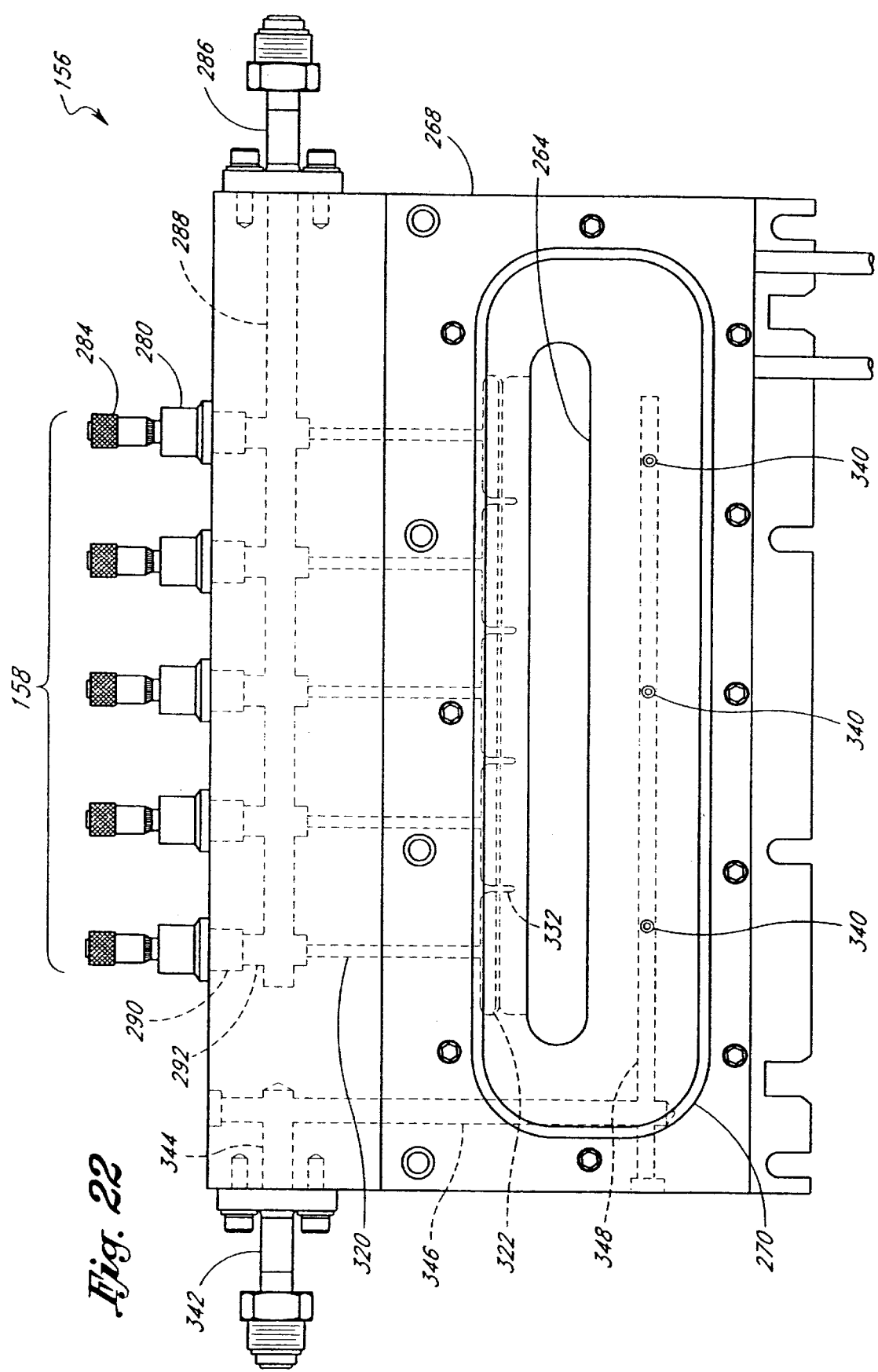

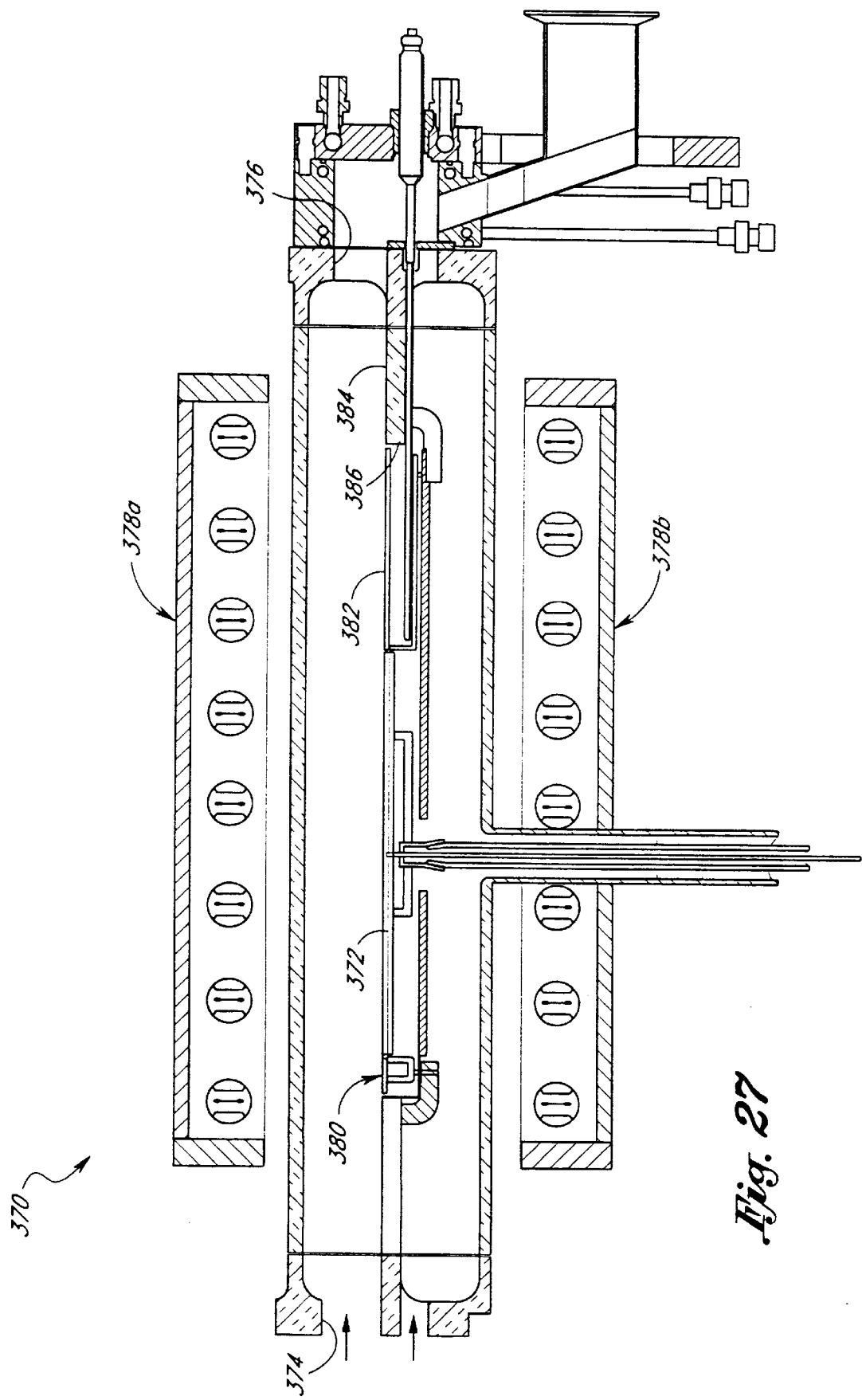

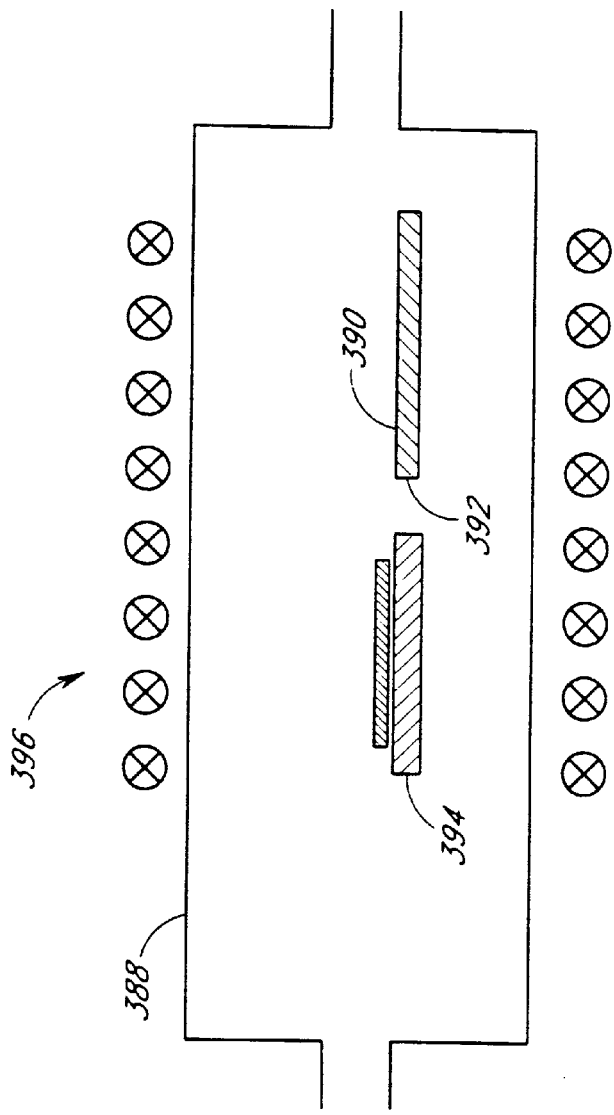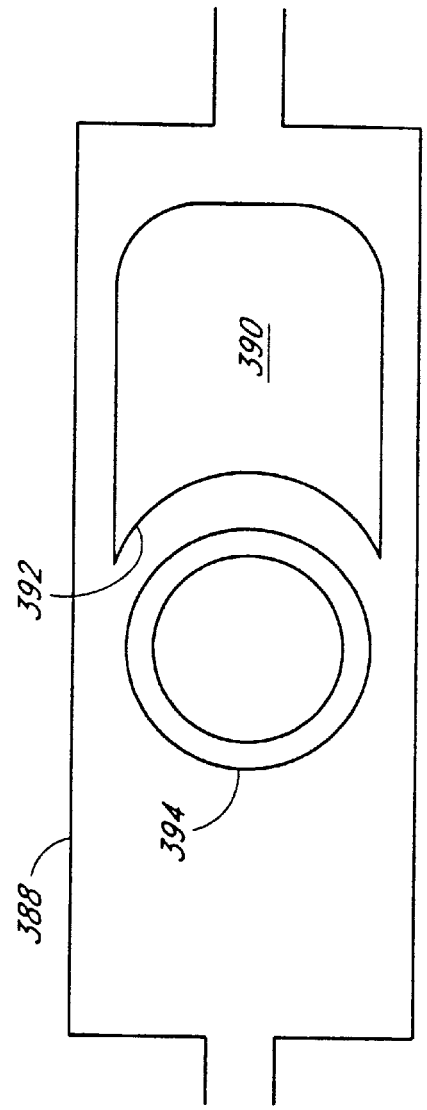

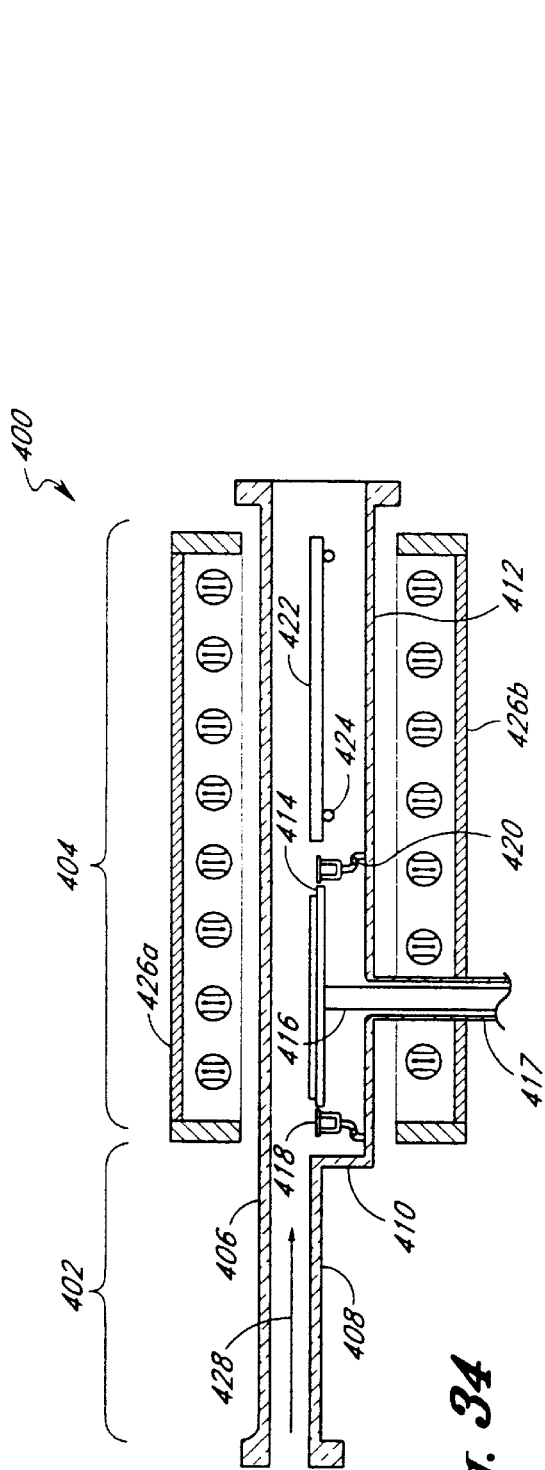
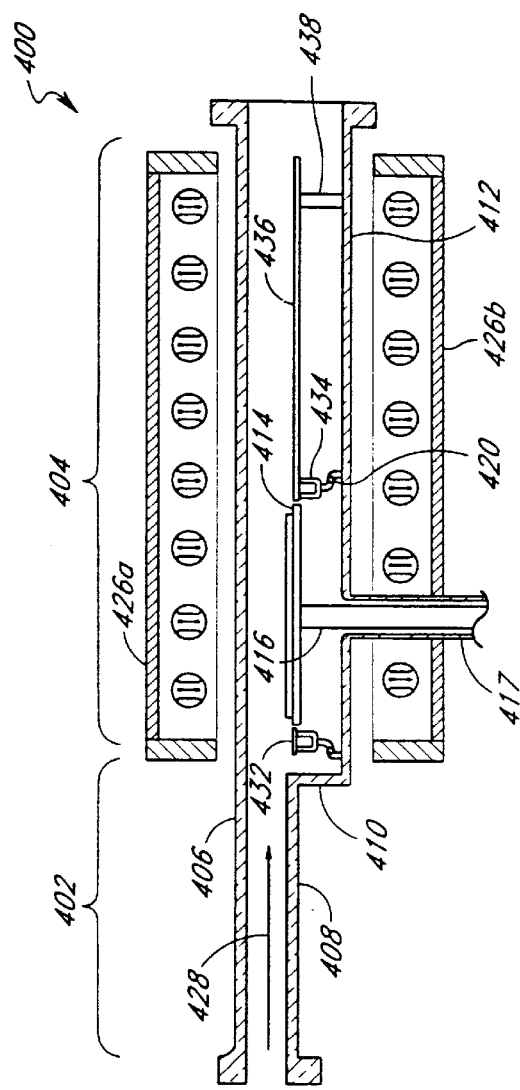
Fig. 34
Fig. 35

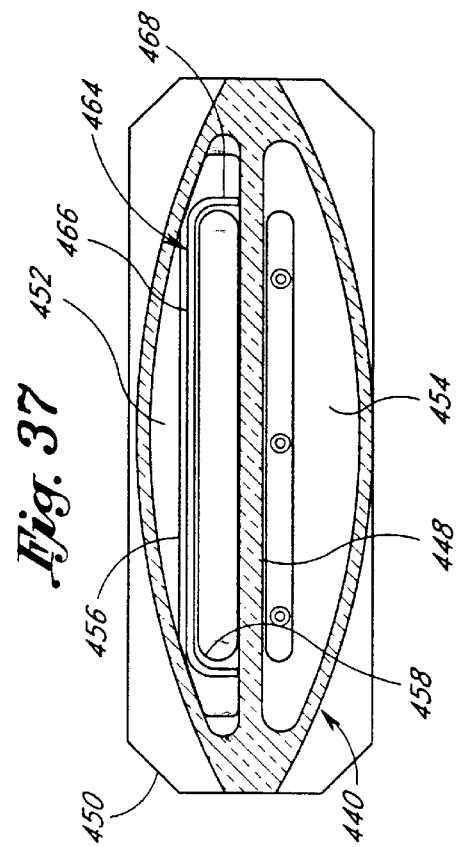
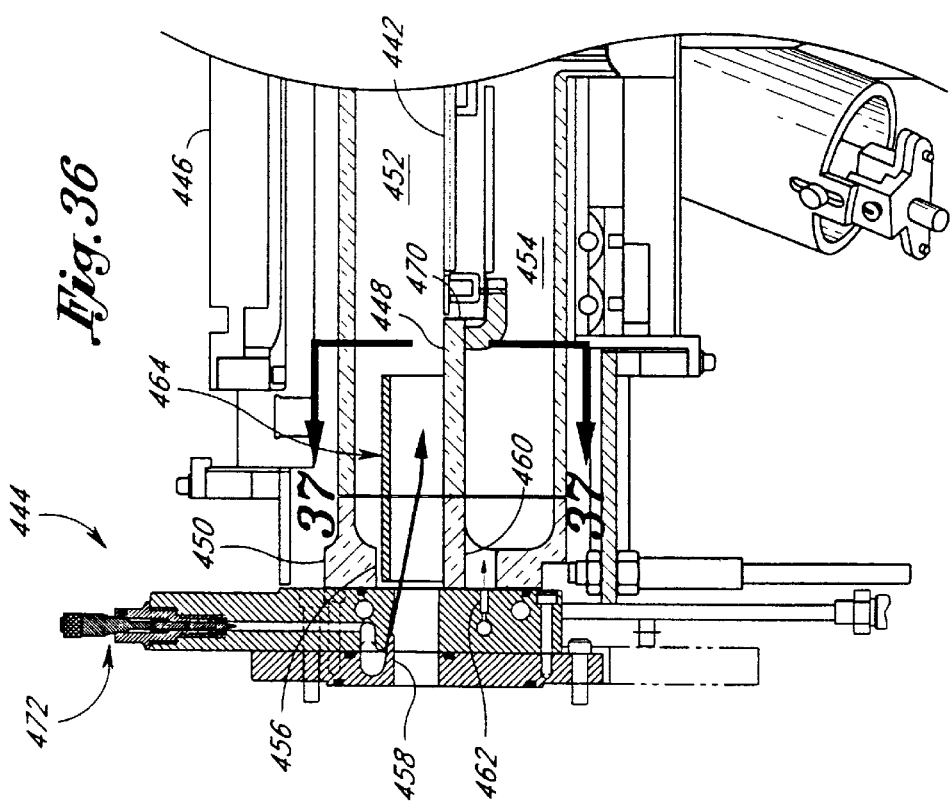

PROCESS CHAMBER WITH DOWNSTREAM GETTER PLATE

REFERENCE TO RELATED APPLICATION

The present application is a division of U.S. application Ser. No. 08/637,616, filed Apr. 25, 1996, now U.S. Pat. No. 6,093,252, which is a continuation-in-part of U.S. application Ser. No. 08/549,461, filed Oct. 27, 1995, abandoned, which claims the priority benefit under 35 U.S.C. §119(e) of provisional Application No. 60/001,863, filed Aug. 3, 1995.

FIELD OF THE INVENTION

This invention relates to process chambers for chemical vapor deposition or other processing of semiconductor wafers and the like. More particularly, the invention relates to a process chamber capable of withstanding stresses associated with high temperature, low pressure processes, and having improved wafer temperature uniformity and gas flow characteristics.

BACKGROUND OF THE INVENTION

Process chambers for thermally processing semiconductor wafers are desirably made of quartz (vitreous silica) or similar material because quartz is substantially transparent to radiant energy. Thus, radiant heaters may be positioned adjacent the exterior of the chamber, and a wafer being processed in the chamber can be heated to elevated temperatures without having the chamber walls heated to the same level. On the other hand, quartz is desirable because it can withstand very high temperatures. Quartz is also desirable because of its inert characteristics that enable it to withstand degradation by various processing gases and because of its high purity characteristics.

For applications in which the pressure within a quartz chamber is to be reduced much lower than the surrounding ambient pressure, cylindrical or spherical chambers are preferred from a strength standpoint because their curved surfaces can best withstand the inwardly directed force. However, when positioning a flat wafer for chemical vapor deposition purposes where the deposition gases flow parallel to the wafer, it is desirable that the chamber wall be parallel to the facing flat surface of the wafer, to obtain even deposition on the wafer surface. Uniform deposition is critical to obtain a high yield of acceptable products to be made from such wafer. However, a flat wall will collapse inwardly with reduced interior pressure sooner than will an outwardly convex wall of similar size and thickness.

To handle the inwardly directed forces on flat wall chambers, gussets have been provided on the exterior of the walls extending generally perpendicular to the walls to which they are joined, as may be seen in U.S. Pat. No. 4,920,918. That patent also illustrates gussets on the exterior of a chamber having upper and lower outwardly convex elliptical walls having a large radius of curvature, thus providing a somewhat flattened, but curved, configuration. This compromise provides some additional strength from the curved walls while not affecting the evenness of deposition appreciably. One significant disadvantage of such design is that the external gussets complicate and interfere with the external positioning of radiant heat lamps. Furthermore, the complexity and mass of the quartz gussets increases material and fabrication expense.

Of course, flat walls can be made thicker to increase strength, but that adds cost and adversely affects heating and cooling characteristics of the chamber.

U.S. Pat. No. 5,085,887 discloses a chamber which includes a circular, slightly domed, or curved upper chamber wall to accommodate the load of reduced chamber pressure. The circular wall is provided with a greatly thickened peripheral flange that radially confines the upper wall to cause the domed wall to bow outward due to thermal expansion, helping to resist the exterior ambient pressure in vacuum applications. The chamber requires a complex mechanism for clamping the thickened exterior flanges of the upper and lower chamber walls.

Due to the high temperatures associated with thermally activated chemical vapor deposition processes, the walls of the process chamber often heat up to a certain degree, and chemical particulates are deposited thereon. These particulates can cause serious problems with the purity of the resulting processed wafer. As a result, there has been a large effort to reduce the buildup of particulate matter on reaction chamber walls. One solution is to periodically etch the insides of the process chambers to remove the particulate matter before it accumulates to a harmful level. Unfortunately, quartz process chambers take a long time to heat up due to their high transparency to radiant heat. These periodic slow etch cycles thus reduce the maximum throughput of the machine.

There has also been attempts at controlling the gas flow profile in parallel across the wafer to be processed so as to create a more uniform deposition. For example, U.S. Pat. No. 5,221,556 discloses a system in which the apertures through a gas inlet manifold are varied in size to allow more gas through one section, typically the center section, as opposed to others. U.S. Pat. No. 5,269,847 includes valves for adjustment of pairs of gas flows merging into a number of independent streams distributed laterally upstream of the wafer to be processed. This system emphasizes the importance of channeling the various gas flows separately until just before the wafer leading edge so as to prevent premature mixing and enable greater control over the flow and concentration profiles of reactant and carrier gases across the wafer.

Another problem which has not been sufficiently addressed in the prior art is that of recirculation of the process gas in parallel flow reactors. More particularly, after the gas travels in parallel over the wafer and susceptor, it may experience temperature gradients between the hot susceptor and cooler chamber walls. This can lead to recirculations as the gas rises toward the walls and is subsequently cooled. Also, the gas flow may be constricted proximate an exhaust conduit which may create turbulence and recirculations. Recirculations from either source may migrate upstream to impact the uniformity of flow in the area of the wafer thus reducing the uniformity of film deposition.

Additionally, the temperature gradient across the wafer is nonuniform from the leading edge to the trailing edge. That is, the temperature of the gas is primarily determined by its proximity to the heat-absorbing susceptor underneath the wafer. As the gas approaches and passes over the susceptor, it heats up fairly quickly to a maximum temperature towards the downstream edge of the susceptor, and then drops off after traveling past that point. This temperature nonuniformity may further negatively affect film deposition uniformity.

A need exists for an improved chamber for chemical vapor deposition purposes, and other high temperature processes, that can be made of quartz or similar materials and yet withstand the stresses incident to reduced pressure processes. There is also a need for a more uniform temperature and flow environment surrounding the wafer to ensure more uniform deposition thereon. Also, a more responsive flow control system is needed. Finally, there is a need for a more energy efficient chemical vapor deposition system with higher throughput.

SUMMARY OF THE INVENTION

Briefly stated, the invention provides a process chamber having thin upper and lower curved walls forming a flattened configuration. The upper and lower curved walls have a convex exterior surface and a concave interior surface. These walls are joined at their side edges to side rails, thus giving the chamber a generally flattened ellipsoidal or lenticular cross section, wherein the internal height of the chamber is less than the width or distance between the side walls. An internal support extending across and joined to the side rails provides the strength necessary to prevent collapse of the chamber when operating in a mode in which the interior of the chamber is at a pressure lower than that outside the chamber.

In a preferred form, the chamber upper and lower walls are generally rectangular in shape, and the spaced side rails extend the length of the walls. This produces an elongated configuration. The internal support is in the form of a plate that includes an inlet section extending to an inlet flange and an outlet section extending to an outlet flange, with a large opening between the two sections. The support plate essentially divides the chamber into an upper and lower region. A susceptor is positioned in the opening in the plate, and is supported on a shaft that extends through a tube depending from the lower wall of the chamber. A semiconductor wafer or other element to be processed can be inserted through the inlet flange and supported on the susceptor approximately aligned with the inlet section of the support plate so that processing gases may flow smoothly over the inlet support plate section and across the surface of the wafer to be processed. In this respect, the upper region of the chamber is preferably exclusively assigned to the task of wafer processing.

The chamber upper and lower walls are preferably made of quartz and are constructed by cutting segments from a large diameter cylindrical tube, or otherwise formed into curvilinear plates. These segments are welded to sidewalls which may be molded or cut to shapes to facilitate welding to the edges of the upper and lower walls. It is also possible, but not preferred, to build this structure with elements having elliptical, parabolic, or slumped plate cross sections, which are not well defined by simple circular, elliptical, or parabolic geometries.

The support plate is also preferably made of quartz and located centered between the upper and lower walls so that the stress on those walls is uniform.

The chamber disclosed thus has the advantages of being able to withstand reduced pressure processing, being made into an integral unit, and not requiring external support elements that interfere with the positioning of radiant heaters for transmitting radiant energy through the thin quartz upper and lower walls. Also, the internal support plate does not interfere with the flow of process gases through the chamber; and in fact, assists in providing the desired gas flow by conducting greater gas flow at the center of the flow path than at the edges. Further, the internal support does not interfere with the insertion or removal from the chamber of wafers, susceptors, or susceptor rings.

In a still further aspect of the present invention, an apparatus for chemical vapor deposition is provided which comprises walls defining a. deposition chamber having a chamber gas inlet and outlet. A generally horizontal quartz inlet wall extends from the inlet of the chamber to a downstream edge defining part of an opening for receiving a susceptor. A generally circular susceptor is horizontally positioned in the opening and receives a semiconductor substrate for vapor deposition purposes. The apparatus further includes a sacrificial quartz plate having a horizontal portion and a vertical lip extending into the opening closely adjacent to the downstream edge of the inlet wall to minimize vapor deposition on and devitrification of the downstream edge. In a particular embodiment, the horizontal portion of the quartz plate rests on the inlet wall. The portion of the opening defined by the downstream edge is curved and the vertical lip may be curved to conform to the curved portion of the opening and is sized to protect one half of the downstream edge of the inlet wall. A second sacrificial plate may be provided having a vertical lip curved to conform to a curved edge of the susceptor or a ring positioned around the susceptor to protect a second half of the downstream edge.

In one particular embodiment the sacrificial plate is supported beneath the inlet wall, and its vertical lip extends upward adjacent the downstream edge of the inlet wall. The sacrificial plate may be in the form of a tray that extends beneath the susceptor and has a central hole for receiving a shaft rotatably supporting the susceptor. The apparatus may include a generally horizontal quartz outlet wall extending downstream from the susceptor and spaced therefrom, whereby an inlet end of the tray is supported beneath the inlet wall and a downstream edge of the tray is supported beneath the outlet wall.

In another aspect, the present invention provides a method of using a chemical vapor deposition chamber, the chamber having a quartz horizontal inlet wall with a downstream edge defining a portion of an opening in which a horizontally extending susceptor is positioned, adapted to receive a substrate. The method includes positioning a vertical lip of a sacrificial quartz plate between the downstream edge of the inlet wall and the susceptor to minimize the vapor deposition on and the devitrification of the downstream edge of the inlet wall. A temperature compensation ring surrounding the susceptor and extending between the susceptor and the downstream edge of the inlet wall may be provided. A vertical lip of the sacrificial plate is preferably positioned in a gap between the temperature compensation ring and the downstream edge of the inlet wall. The method may include providing a short, horizontally extending flange on the upper edge of the vertical lip, with the flange extending upstream over the downstream edge of the inlet wall.

In a still further embodiment, the chamber also includes a quartz horizontal outlet wall with an upstream edge which, in combination with the downstream edge of the inlet wall and chamber, defines the opening in which the susceptor is positioned. The ring is circular and the sacrificial quartz plate has an inner diameter which closely conforms with the outer diameter of the ring. The quartz plate has an outer shape which conforms with and desirably abuts against the opening, which preferably has a rounded rectangular shape. In this manner, the edges of the opening are protected from devitrification from repeated heating of the reaction chamber. The sacrificial quartz plate is desirably shaped to closely fit within the opening with a minimum of clearance therebetween, and may be supported by modified fingers or support elements attached to the inlet and outlet walls.

In accordance with a further preferred embodiment, the present invention provides an apparatus for use in a chemical vapor deposition chamber comprising a temperature compensation ring having an interior edge defining a generally circular opening for receiving a susceptor adapted to support a semiconductor, and a generally rectangular exterior edge. Preferably, the ring has rounded exterior corners, a leading edge, a trailing edge, and a pair of exterior side edges. The shortest distance between the leading exterior edge and the interior edge is desirably less than the shortest distance between the trailing edge and the interior edge. The ring is preferably made of graphite and has an inner generally hollow portion adapted to receive one or more temperature sensors therein. The ring has a generally flat, nontubular leading edge portion extending forwardly from the hollow portion, and a generally flat, nontubular trailing edge portion extending rearwardly from the hollow portion.

In another preferred embodiment, the present invention includes a process chamber gas injector having multiple tuned ports distributed laterally across the width of the injector to control the velocity profile of the process gas over the wafer to be processed. The injector is preferably formed of two juxtaposed plates with a plurality of flow control valves mounted in one. A single gas input supplies a plenum common to the flow control valves so that an equal pressure of gas is provided upstream of the valve mechanisms of each of the valves. Narrow channels lead from each valves to separated expansion chambers formed in the injector before the independently metered flows are mixed while passing through a slit-like opening forming an outlet of the injector. A smoothed ribbon of process gas with a predetermined gas velocity profile is thus directed into the chamber and over the wafer. This ribbon of gas flow is formed a significant distance upstream of the wafer leading edge so as to provide adequate distance and time for the separate streams of flow to blend together by diffusion, thereby smoothing the gas density profile laterally across the wafer.

In another form, the present invention provides a quartz process chamber having a support structure for a susceptor and wafer thereon. A temperature compensation ring surround the susceptor and is preferably made of the same high thermal mass material as the susceptor to help maintain the temperature of the susceptor more uniform. Upper and lower banks of heat lamps are positioned outside of the chamber to heat the susceptor and ring. Desirably, the lamps are sized the same as the exterior dimension of the ring to focus radiant energy where it is needed and conserve energy used by the system. In one embodiment, the ring has a circular interior edge sized to closely surround the susceptor and a rounded rectangular exterior edge sized to fit closely within a similarly shaped aperture in an inner chamber support plate.

BRIEF DESCRIPTION OF THE DRAWINGS

FIG. 4 is a top plan view of the chamber.

FIG. 5 is a view of the inlet end of the chamber.

FIG. 6 is a view of the outlet end of the chamber.

FIG. 7 is a side elevational view of the chamber.

FIG. 8 is a cross-sectional view illustrating the chamber connected to a portion of a wafer processing system.

FIG. 9 is a plan view of an alternative ring surrounding a susceptor and within an aperture of an inner chamber support plate.

FIG. 10 is a plan view of a sacrificial plate positioned within an aperture in a chamber support plate.

FIG. 11a is a cross-sectional view of the process chamber of FIG. 11.

FIG. 12 is an exploded perspective view of the second embodiment of the process chamber incorporating an enlarged temperature compensation ring and a sacrificial quartz plate.

FIG. 12a is a cross-sectional view of the temperature compensation rings.

FIG. 13 is a top plan view of the sacrificial quartz plate shown in FIG. 12.

FIG. 14 is a cross-sectional view through the sacrificial quartz plate of FIG. 13.

FIG. 22 is a rear elevational view of the gas injector of FIG. 21 shown detached from the processing chamber and illustrating internal gas flow channels.

FIG. 27 is a cross-sectional view of a further embodiment of a process chamber incorporating a modified temperature compensation ring surrounding a susceptor and extending downstream of the susceptor and wafer to be processed.

FIG. 28a is a schematic vertical cross-section through a process chamber similar to that shown in FIG. 27 depicting a downstream structure in relation to the susceptor and wafer.

FIG. 28b is a plan view of FIG. 28a.

FIG. 34 is a cross-sectional view of an alternative process chamber having a structure downstream from a temperature compensation ring.

FIG. 35 is a cross-sectional view of the process chamber of FIG. 34 having a temperature compensation ring extended downstream.

FIG. 36 is a cross-sectional view illustrating an upstream portion of a processing chamber incorporating a flow control channel.

FIG. 37 is a cross-sectional view through the flow control channel of FIG. 36 looking toward an inlet flange of the chamber.

DETAILED DESCRIPTION OF THE PREFERRED EMBODIMENT

Figure 1:
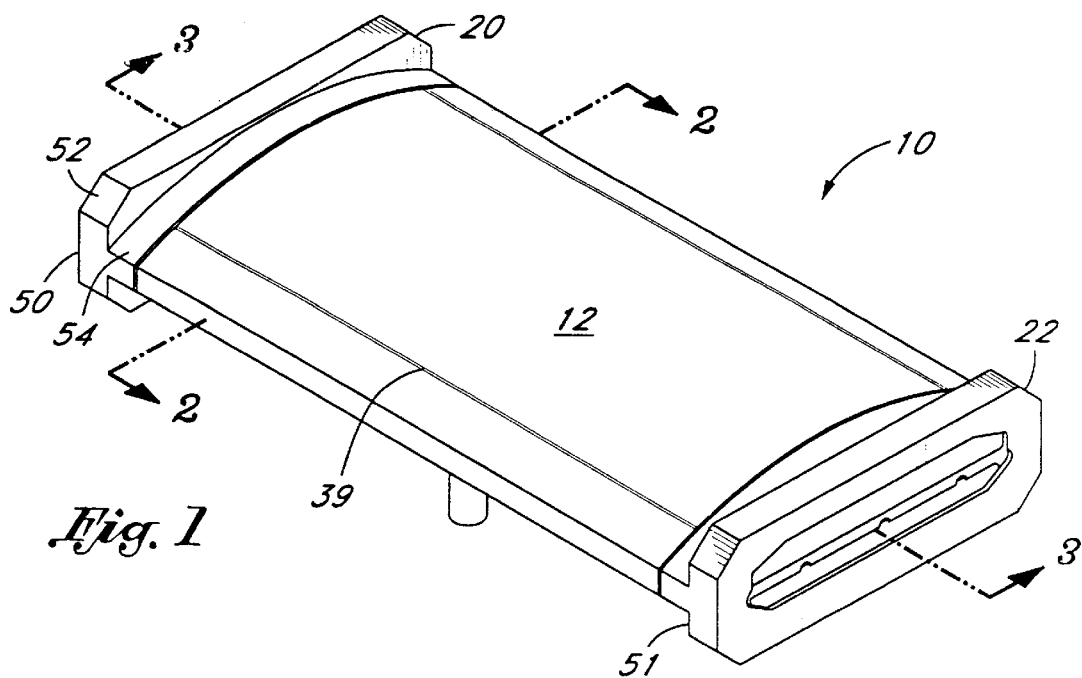
FIG. 1 is a perspective view of one embodiment of a process chamber of the invention.

Lenticular Process Chamber Referring to FIGS. 1–11, one embodiment of a reactor vessel or chamber 10 for chemical vapor processing and the like is illustrated. As can be seen, the chamber 10 has an elongated, generally flattened configuration which in cross section has a generally lenticular shape. A lenticular shape has opposed biconvex surfaces which may have circular curvatures. The chamber has an upper wall 12 with an outer convex surface and an inner concave surface, and a lower wall 14 with an outer convex surface and an inner concave surface. The walls 12 and 14 are connected by vertically short side rails 16 and 18. These walls and side rails are further joined by an upstream inlet end flange 20 and a downstream outlet end flange 22. Upstream and downstream relate to the direction of process gas flow, as will be described, and are synonymous in the present description with front and rear.

The chamber height is less than the chamber width. In this respect, a longitudinal direction for the chamber 10 extends from the inlet end flange 20 to the outlet end flange 22, or along the section line 3—3. A lateral direction extends between the short side rails 16 and 18, or along the section line 2—2. The height direction is perpendicular to both the longitudinal and lateral axes. Looking at the end view of FIG. 2, the lenticular chamber 10 has a major dimension extending between the side rails 16 and 18, and a minor dimension extending between the apexes of the upper and lower walls 12, 14.

With reference to FIG. 4, both the upper wall 12 and the lower wall 14 are thin, curved plate-like elements having a rectangular flat vertical projection. The walls 12 and 14 desirably have a circular radius of curvature and may be formed by segments cut from a cylindrical tube made of quartz or similar material. In larger chambers, the walls 12 and 14 may be constructed by heating and forming flat quartz plates. Unwanted stresses are introduced in curved walls with varying radii and thus a circular wall with a constant curvature is the optimum design. In one preferred embodiment, the upper wall 12 and lower wall 14 have a radius of curvature of approximately 24 inches, and have a thickness of between 4 and 6 millimeters, and more preferably the wall thickness is approximately 5 millimeters. Although quartz is preferred, other materials having similar desirable characteristics may be substituted. Some of these desirable characteristics include a high melting point, the ability to withstand large and rapid temperature changes, chemical inertness, and high transparency to light.

Figure 2:
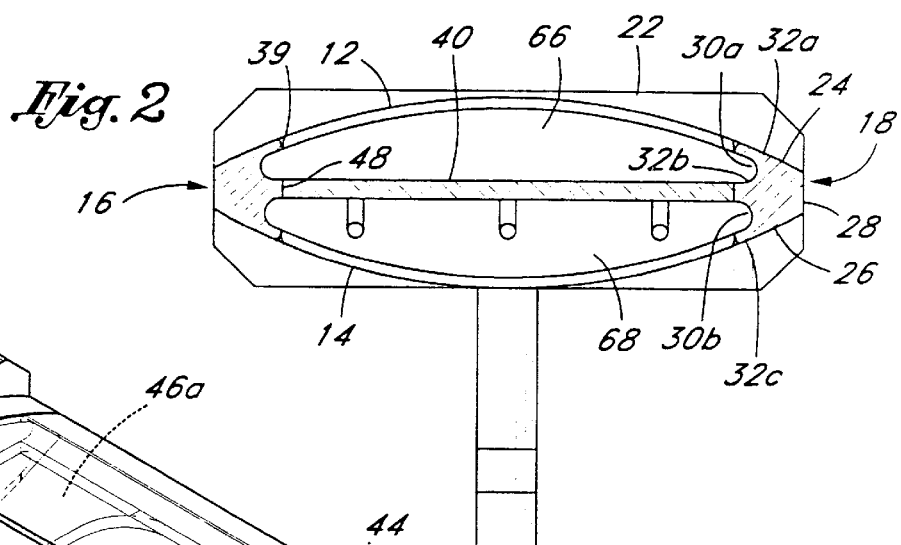
FIG. 2 is a cross-sectional view on line 2—2 of FIG. 1.

The thick side rails 16, 18 may be machined from a quartz rod of rectangular cross section or otherwise formed into the cross sectional shape illustrated in FIG. 2. More specifically, each side rail 16, 18 includes a reinforced main body having an upper surface 24 that forms a continuation of the curved exterior surface of the upper wall 12, and a lower surface 26 which is curved to form a continuation of the exterior surface of the lower wall 14. The laterally exterior surface 28 of each side rail 16, 18 is flat and extends vertically. The interior surface of each side rail 16, 18 is formed with longitudinally extending upper and lower recesses 30a, 30b that create upper, middle and lower stub wall segments 32a, 32b, 32c, respectively. The upper and lower stub wall segments 32a, 32c mate with the side edges of the upper and lower walls 12 and 14 at longitudinal weld joints 39. In one embodiment, the main body of the side rails 16, 18 has a thickness or width dimension of about 20 mm and a height of about 21 mm.

Inner Chamber Support

Figure 3:
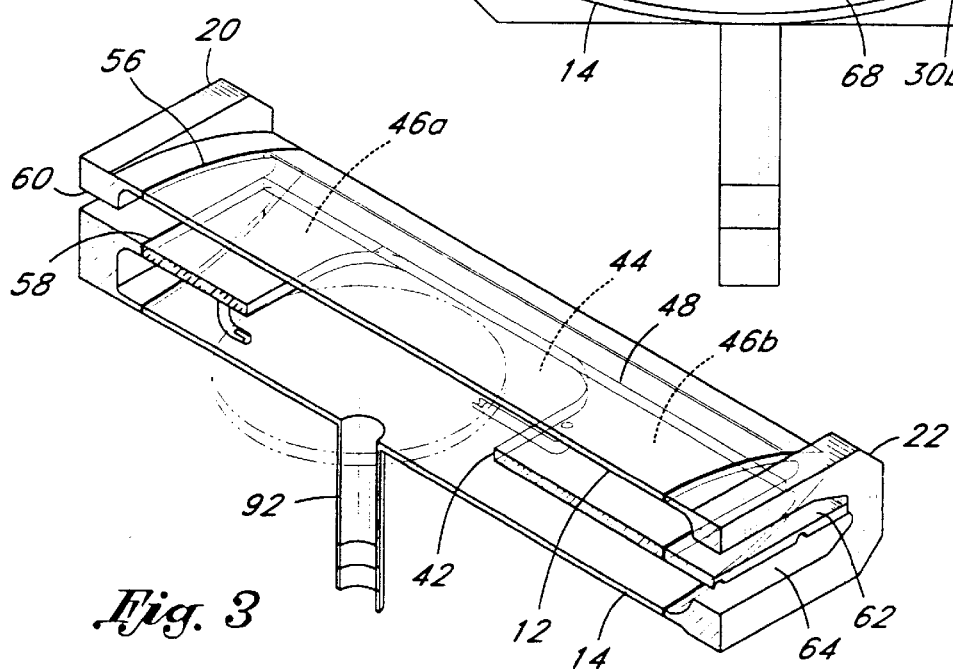
FIG. 3 is a perspective view of one-half of the process chamber from a vertical-longitudinal plane looking along line 3—3 of FIG. 1.

In accordance with the invention, there is provided a support or stringer preferably in the form of a flat, rectangular support plate 40 that extends between the side rails 16 and 18. As seen in FIG. 3, the support plate 40 includes an aperture 42 defining a void or opening 44 extending across the width of the chamber 10 and dividing the support plate into an inlet section 46a and an outlet section 46b. The inlet section 46a extends from the inlet flange 20 to an upstream edge of the opening 44, and the outlet section 46b extends from a downstream edge of the opening 44 to the outlet flange 22. As may be seen from FIG. 4, the inlet section 46a of the support plate is shorter in the longitudinal direction than is the outlet section 46b. More specifically, in a preferred arrangement, the inlet section is about 70% of the length of the outlet section. That proportional arrangement relates to the process gas flow through the chamber rather than to the strength characteristics of the chamber walls.

As best seen in FIG. 2, each of the side rails 16 and 18 includes the inwardly extending central stub wall 32b that in effect forms an extension of the support plate 40. In this respect, the support plate 40 in practice terminates at the main body of the side rails 16, 18, or, in other words, at the laterally outer extent of the recesses 30a,b. Longitudinal joints 48 indicate the welded connection between the lateral edges of the support plate 40 and the central stub walls 32b of each of the side rails 16 and 18.

In an important aspect of the chamber 10, the central stub walls 32b precisely bisect the upper and lower walls 12 and 14, and the support plate 40 thus lies on the exact centerline or center plane therebetween. This desirable location creates stresses only within the plane of the plate 40 imposed by lateral displacement of the side rails 16, 18. Such displacement occurs in reduced pressure processing as the walls 12, 14 try to flatten out and exert outward forces thereto. By designing this symmetry, the support plate 40 undergoes no significant bending or shear stresses and is able to thus withstand greater overall normal stresses.

End Flanges

Referring to FIGS. 1 and 3, each of the end flanges 20, 22 comprise outer, generally rectangular slabs 50, 51, respectively, having chamfered corners 52 and inner lenticular shaped extensions 54. As seen from FIG. 3, the inner extensions 54 conform to the shapes of the upper and lower walls 12, 14 and the central support plate 40. More particularly, short longitudinal portions extend from the slabs 50 to join with each of these plate-like members. At each end of the chamber 10, curvilinear weld joints 56 are formed between the curved upper and lower walls 12, 14 and the upper and lower portions of the extension 54, while linear joint lines 58 are defined between central portions of the extension 54 and the longitudinal ends of the support plate 40. The slab 50 of the inlet flange 20 includes a laterally extending aperture 60 in an upper portion which leads into a region 66 within the chamber 10 above the support plate 40 and below the upper wall 12. The slab 51 of the outlet flange 22, in contrast, includes a pair of laterally extending apertures 62 and 64. The upper aperture 62 communicates with the upper region 66 of the chamber 10 previously described, while the lower aperture 64 communicates with a lower region 68 of the chamber 10 below the support plate 40 and above the lower wall 14. The rounded recesses 30a,b in the side rails 16, 18 define lateral boundaries of the upper and lower regions 66, 68. As will be described below, the wafer processing is done in the upper region 66 only, with the support plate 40 defining the lower boundary of the process zone.

Support Plate Opening

The opening 44 is dimensioned to receive a susceptor 70, as illustrated in FIG. 8, and a temperature compensation ring 72 which surrounds the susceptor. The susceptor 70 is adapted to rotate within the stationary ring 72 and is preferably spaced therefrom across a small annular gap of about 0.5 to 1.0 mm. The centerline of the ring 72 is schematically illustrated in FIG. 4 by the broken line circle 74 shown therein. The shape of the aperture 42 in the support plate 40 surrounding the ring 72 can also be made circular so that the edges of the opening 44 would be in close proximity to the ring. However, it has been found that somewhat of a rectangular aperture 42 having rounded corners, as shown in FIG. 4, is preferred. The support plate sections 46a,b may be cut to provide those exact shapes; or for manufacturing convenience, short, somewhat triangular sections 76 of fill, shown in FIG. 4, may be welded to the plate sections and the chamber side rails 16, 18 to provide the desired configuration.

During use, pressure differentials between the interior of the chamber 10 and the outside ambient pressure create stresses in both the upper and lower walls 12, 14 and the side rails 16, 18. The laterally inward and outward movement of the side rails 16, 18 is restricted by their fixed attachment to the central support plate 40. In vacuum processing, as mentioned above, the walls 12, 14 will attempt to flatten out which imparts generally outward forces on the side rails 16, 18. The support plate 40 is placed in tension and restricts outward displacement of the side rails 16, 18. Between the inlet and outlet sections 46a,b, however, there is no support for the side rails 16, 18 and along this region some displacement is possible causing stresses in the rails. Finite-element analyses have shown that a rounded rectangular aperture 42 is preferable to a completely circular aperture because the maximum stress in the plate illustrated is spread across a length of the aperture, whereas with a circular aperture, the greatest stress point would be at the points on the plate along its centerline. Put another way, the rectangular aperture 42, defines two opposed lengths extending laterally between the side rails 12, 14 over which the maximum stresses are distributed, as opposed to at two opposed points on a circular aperture.

It will be noted that the circle 74 shown in FIG. 4 is not centrally positioned with respect to the upstream and downstream ends of the chamber, or with respect to opening 44. Instead, the upstream or leading edge of the circle 74 is closer to the downstream edge of the inlet plate section 46a than is the downstream or trailing edge of the circle to the upstream edge of the outlet plate section 46b. This arrangement helps maintain the strength of the chamber by reducing the rate of devitrification of the upstream edge of the outlet plate section 46b. That is, the gas flow heats up as it passes over the susceptor so that the temperature in the chamber walls tends to be the greatest just downstream from the susceptor. The upstream edge can therefore be exposed to significant thermal cycling and devitrification if too close to the susceptor, and thus the susceptor is offset forwardly within the opening 44 to increase the spacing therebetween. In some configurations, this offset arrangement also affects the flow of the process gases through the chamber. More particularly, the wafer placed upon the susceptor which is surrounded by the ring is positioned close to the downstream edge of the inlet plate section 46a to minimize the amount of reaction gases which pass through the opening 44 upstream of the wafer. This minimizes the amount of reaction gas which can deposit underneath the susceptor in the lower portion 68 of the chamber 10.

Susceptor and Related Structure

As seen from FIG. 8, the temperature compensation ring 72 is supported by three elbow-shaped support elements having vertically extending portions being welded to the support plate sections. More specifically, a front support element or finger 80 is welded to the rear of the front plate section midway between the rails 16, 18 of the chamber, and the horizontal portion of the element extends rearwardly into the opening 44 so as to be positioned under the leading edge of the temperature compensation ring 72. A pair of spaced elements or fingers 82 have elongated horizontal portions that extend forwardly beneath the trailing edge of the compensation ring 72 as seen in FIG. 8, as well as FIGS. 2–7. The compensation ring 72 is thus supported in a horizontal plane at three points by upstanding pins (not shown) in the fingers 80 and 82. The pins may eventually deteriorate from repeated thermal cycling and exposure to process and etch gases, but they can be replaced fairly readily.

A susceptor 84 is shown supported on arms 86 of a suitable support 88 connected to the upper end of a rotatable shaft 90 that extends through a tube 92 depending from the bottom wall of the chamber. The susceptor 84 is shown approximately level with the upper edge of the ring 72 and with the upper surface of the support plate 40. This enables a wafer to be positioned above the susceptor 84 and in the upper portion 66 of the process chamber 10.

Still referring to FIG. 8, the inlet flange 20 is adapted to be connected to an inlet component 94 having a horizontally elongated slot 96 through which a wafer may be inserted, and having an elongated inlet 98 for introducing process gas into the upper portion 66 of the chamber after an isolation valve leading from the slot 96 to a wafer handling chamber (not shown) has been closed. Correspondingly, the outlet flange 22 is adapted to mate with an outlet component 100 for exhausting process gas from the chamber 10, as well as applying a vacuum to the chamber. As can be seen from FIG. 8, the outlet flange 22 is open to the lower portion 68 of the chamber beneath the support plate as well as the portion 66 above the support plate.

A plurality of thermocouples 102 extends through the outlet component 100 and into the lower portion 68 of the process chamber 10. The thermocouples 102 extend into proximity of the susceptor 84 to sense the local temperature surrounding the susceptor 84 and wafer positioned there above. As has been described previously in U.S. Pat. No. 4,821,674, the advantageous positioning of the sensing ends of the thermocouples 102 surrounding the susceptor 84 allows comprehensive feedback regarding the temperature of the wafer and enables adjustment of radiant heating lamps surrounding the chamber 10 to compensate for temperature irregularities. More particularly, a leading edge thermocouple 104 terminates proximate the front end of the susceptor 84, a trailing edge thermocouple 106 terminates proximate a rear edge of the susceptor and a lateral thermocouple (not shown) terminates proximate a lateral edge of the susceptor. Each of the thermocouples 102 enters the temperature compensation ring 72 which is formed of two parts to provide a hollow interior therein. Again, this ring has been described previously in U.S. Pat. No. 4,821,674, which is hereby expressly incorporated by reference. The temperature compensation ring 72 includes generally L shaped inner and outer bodies which cooperatively define an annular passage through the ring for receiving the thermocouples 102.

Preferably, the temperature compensation ring 72 is constructed of graphite or other such high heat absorbency material. The ring 72 provides several advantages in the processing environment, primarily reducing edge heat losses from the susceptor 84. More specifically, the ring 72 closely surrounds the edge of the susceptor 84 and is maintained at a similar temperature during processing, as the materials are similar. The susceptor and ring thus radiate heat toward one another to effectively cancel any radiant losses therebetween. Another advantage of the temperature compensation ring 72 is preheating and postheating of the reactant gas in the region of the wafer. Specifically, the reactant gas enters the chamber at an ambient, non-reacting temperature and is heated to a temperature suitable for deposition as it passes over the susceptor and wafer. The surrounding temperature compensation ring 72 thus preheats the reactant gas stream before it reaches the leading edge of the susceptor, and, subsequently, the leading edge of the wafer. The process gas thus reaches an approximately steady state temperature before traveling over the edge of the wafer. Additionally, the temperature of the gas does not significantly drop off after passing the downstream edge of the wafer as the temperature compensation ring 72 extends the downstream heating region. Further advantages of the temperature compensation ring 72 will be described below with reference to modified rings.

The gas flow through the chamber is shown in FIG. 8. Reactant gas enters through the inlet component 94 with a predetermined lateral velocity profile, such as the profile described in U.S. Pat. No. 5,221,556, which is hereby expressly incorporated by reference. The predetermined velocity profile provides a larger gas flow towards the central portion of the reaction chamber 10 than the laterally outer edges to compensate for the longer deposition travel path over the center of the circular wafer supported on the susceptor 84. In other words, a greater amount of reactant gas is needed over the central portion of the wafer due to reactant depletion along that flow path over the wafer. Further, the cross sectional shape of the chamber 10, as best seen in FIG. 2, accommodates greater gas flow at the center of the chamber where greater reactant gas flow is needed, rather than at the lateral edges where less reactant gas flow is needed.

The reactant gas continues longitudinally rearward as indicated by arrow 112 and exits through the outlet component 100 and downward through exhaust conduits 114, as indicated with arrow 116. Typically, purge gas is supplied upward through the hollow tube 92 surrounding the shaft 90, the tube being sized to provide a gas passage surrounding the shaft. The purge gas enters the lower portion 68 of the chamber 10 as indicated by arrows 118. The purge gas prevents unwanted deposition of particulates underneath the susceptor 84 and exits through the lower longitudinal aperture 64 in the outlet flange 22, as indicated by arrow 120. The purge gas then mixes with the spent reaction gas and continues down along the path of arrow 116 through the exhaust conduits 114.

The end flanges 20, 22 are preferably translucent and fabricated from quartz having nitrogen bubbles dispersed therein. The central thin walls 12, 14 and support plate 40, on the other hand, are transparent to radiant energy, allowing radiant heating of the susceptor and wafer in the chamber 10, without creating high temperatures in these structures. The translucent flanges 20, 22 scatter radiant energy to reduce "light-piping" therethrough. This protects O-rings 122 outside of the flanges 20, 22 from exposure to extreme temperatures generated within the chamber 10. Preferably, a section of the tube 92 below the lower wall 14 is similarly translucent from nitrogen bubbles dispersed therein.

As mentioned, one advantage of the chamber disclosed is that it can withstand reduced internal pressure with relatively thin quartz chamber walls. For example, for a chamber designed to accommodate an 8-inch diameter wafer (approximately 200 millimeters) the upper and lower walls 12, 14 may require a wall thickness of only about 5 millimeters with the support plate thickness being about 10 millimeters. The chamber length between end flanges is about 600 millimeters, with the chamber width being about 325 millimeters, and with the height of the end flanges being about 115 millimeters. The dimensions for the chamber will obviously be modified for larger size wafers. For example, the present chamber invention is suitable for processing wafers having diameters of 200 millimeter, 300 millimeter and even larger. Preferably, the relative cross-sectional dimensions will remain the same, and thus a wider chamber to accommodate 300 millimeter wafers will have a larger height. The increased height in the chamber for 300 millimeter wafers will necessitate certain modifications to other subsystems, such as the radiant heat lamps disposed around the chamber for heating the susceptor and wafer. In short, although the surrounding environments for processing 200 and 300 millimeter diameter wafers may necessarily differ in certain respects, these differences are within the skill of one practiced in the art of process chamber construction and operation.

The particular dimensions are, of course, given merely by way of example in that chambers of various shapes and dimensions may be utilized with a support plate extending between side walls, or across the longer dimension of the vertical-lateral cross section of the chamber. One generalization that may be made is that the overall chamber width is preferably approximately three times the chamber height. This means that the upper region 66 has a width-to-height ratio at the lateral centerline of approximately six. In the present embodiment, as mentioned above, the walls 12 and 14 may have a constant curvature with a radius of 24 inches. It should be noted that if width-to-height ratio increases substantially, the upper and lower walls 12 and 14 flatten out and are less able to withstand bending stresses without failure when subjected to an inner vacuum. On the other hand, if this ratio decreases substantially, the curvature of the walls 12 and 14 becomes more pronounced and the heat lamps must be spaced farther from the wafer and susceptor 84, reducing control of the heat distribution around the wafer. The tensile stresses experienced by the support plate 40 increase as the width-to-height ratio increases and the chamber flattens out. For a constant chamber vacuum, the tensile stress experienced by the support plate 40 increases at a greater rate than the increase in the chamber width-to-height ratio. That is, for example, starting from a cylindrical chamber shape having a width-to-height ratio at the lateral centerline of 2:1 in the upper region 66, a doubling of this ratio to 4:1 results in a more than double increase in the stress imposed on the support plate 40. Any tensile stresses absorbed by the support plate 40 necessarily relieve inward bending stresses otherwise imparted to the curved chamber walls 12 and 14. Thus, an optimum chamber width-to-height ratio may be determined which enables low pressure processing with a relatively low-profile chamber cross-section.

The chamber 10 may also desirably retrofit into existing systems utilizing rectangular cross-sectional chambers, further increasing the utility of a low, wide shape. The chamber shape beneficially enables the wafers to be inserted from one end, and enables replacement susceptors and rings to be inserted from the other end of the chamber. Such an arrangement also conveniently enables the gas flow to be introduced from end-to-end through the chamber with the gas flowing above the internal support plate approximately aligned with the wafer to be processed within the chamber.

In an alternative embodiment shown in FIG. 9, a modified temperature compensation ring 72' is built outward to conform closely with the rounded rectangular aperture 42 in the support plate 40. The ring 72' thus substantially seals the upper portion 66 and lower portion 68 of the reaction chamber 10 from each other. In this manner, reaction gas in the upper portion 66 cannot travel through gaps formed between the ring 72' and the aperture 42, possibly disrupting the uniform flow over the wafer.

In a still further embodiment shown in FIG. 10, a sacrificial quartz plate 124 is provided surrounding the circular ring 72. The sacrificial plate 124 has an inner diameter which closely conforms with the outer diameter of the ring 72, and an outer shape which conforms with and desirably abuts against the rounded rectangular aperture 42. In this manner, the edges of the aperture 42 are protected from devitrification from repeated heating of the reaction chamber 10. This enables the sacrificial plate 124 to be replaced when it devitrifies from repeated heat cycles, while preserving the more expensive and permanently mounted support plate 40. In practice, the plate 124 is shaped to closely fit within the aperture 42 with a minimum of clearance therebetween, but due to manufacturing tolerances enabling the plate to fit within the aperture, a contact fit is not possible. The plate 124 is preferably supported by modified fingers 80, 82, or by separate support elements (not shown) attached to the support plate 40.

Process Chamber Assembly Procedure

Prior to describing further modifications to the present process chamber, the construction of the quartz chamber will be explained. The reaction chamber 10 is manufactured in a preferred sequence to ensure accurate dimensions and minimize the internal stresses within the component parts. More particularly, the reaction chamber 10 is fabricated first by welding the two side rails 16 and 18 to the end flanges 20 and 22. As was described previously with respect to FIG. 3, the flanges 20 and 22 each have inwardly directed extensions 54 which conform to the shape of the side rails 16 and 18. Subsequent to connecting the side rails and end flanges, the assembly is annealed at an elevated temperature to reduce internal stresses. The central support plate 40 is then welded within the rectangular shape formed by the central stub plates 32b of the side rails 16, 18 and the central inward extensions of the end flanges 20 and 22. After the support plate 40 is welded, the entire assembly is once again annealed to reduce internal stresses. The support elements 80 and 82 are then welded to the underside of the support plate 40 in the appropriate positions. The corner fillers 76 are welded in place to define the rounded rectangular aperture 42. All of the sharp edges within the chamber 10 are then ground down to smooth rounded edges. At this point, the upper and lower walls 12 and 14 are welded to both the side rails 16 and 18 and the end flanges 20 and 22. The assembly is once again annealed to reduce internal stresses. The tube 92 is then welded in place coaxially with a round aperture formed in the lower wall 14.

The assembly is then fire polished at an elevated temperature to cause the surface of the quartz to melt slightly and smooth the surface formed by grinding and welding operations. The fire polishing is an essential step in the formation of the chamber 10 to strengthen the chamber for subsequent fabrication steps and use. Finally, the entire assembly is annealed to reduce any residual internal stresses. It is understood by those skilled in the art that quartz chamber fabrication is a complex and delicate operation and is considered an art form. Thus, the above-described procedure is intended to set forth one particular manner of construction, and others could be followed.

Severe internal stresses can be produced by localized welding. To minimize stresses, the entire chamber is preferably inserted into an elevated temperature oven and assembled therein. The sequence of events is as follows. The elements of the process chamber are positioned within a large oven having a large doorway through which a worker can reach and manipulate the chamber components. The oven is first sealed and raised to an elevated temperature, preferably approximately 900° C. Once the particular temperature is reached, and all the quartz components therein are at that temperature, the large doorway is opened to allow access by the welder. A number of heat screens or baffles are positioned around the chamber between the hot quartz pieces and the doorway to reduce the radiated heat through the doorway. The screens are thus arranged to allow the welder access to a localized portion of the chamber to be welded, and minimize heat radiated from the hot quartz components surrounding that region. The welder is dressed appropriately in heavy welding gloves, a reflective suit and helmet. After the doorway to the oven is open, the temperature within reduces to approximately 500–700° C. Some supplemental localized heating may be required to replenish the heat loss through the open door. This supplemental heat may be provided, for example, with a blow torch, either focused or diffused. The aforementioned sequence of welding is then accomplished within the oven, with the oven door being closed and the chamber parts being reheated periodically if too much heat is lost. This procedure greatly reduces the internal stresses within the quartz pieces by avoiding large temperature gradients therein.

Processing System

Figure 11:
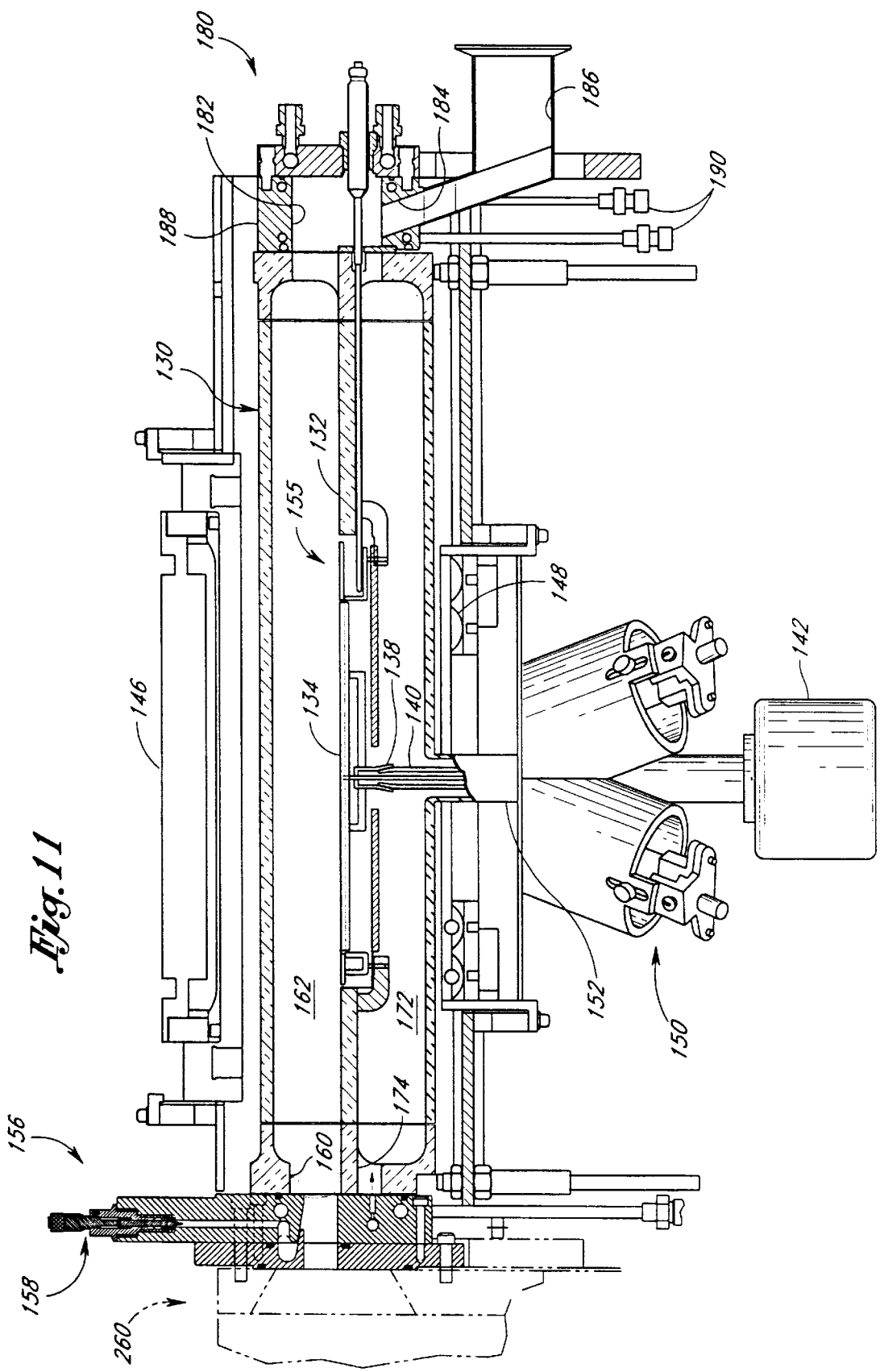
FIG. 11 is a cross-sectional view illustrating a processing system environment used in conjunction with a second embodiment of the process chamber of the present invention.

FIG. 11 illustrates a particularly successful arrangement of components surrounding a modified reaction chamber 130 to produce highly uniform chemical vapor deposition. Prior to describing the particulars of the modified chamber 130, the processing environment will be described. The chamber 130 includes an inner support plate 132 which is similar to the inner support plate 40 as previously described, and thus includes an aperture 133 formed therein sized to receive a susceptor for supporting a semiconductor wafer. The support plate 132 is divided into a front section 135a upstream of the aperture 133 and a rear section 135b downstream of the aperture 133. A susceptor 134 is positioned on a plurality of radially extending arms 136 of a central hub 138 mounted on a hollow shaft 140. The shaft 140 is, in turn, rotated by a motor 142 disposed below the chamber 130. The rotational coupling between the motor 142 and shaft 140 is explicitly described in U.S. Pat. No. 4,821,674, previously incorporated by reference. The motor 142 is preferably mounted on a fixed frame and includes adjustment mechanisms for positioning the susceptor 134 within the chamber 130.

A wafer 144 is shown resting on the susceptor 134 in FIG. 11a. A plurality of radiant heat lamps are arranged around the reaction chamber 130 to heat the susceptor 134 and wafer 144 thereon. A first bank of upper lamps 146 extends longitudinally with respect to the chamber 130. A second lower bank of lamps 148 extends laterally with respect to the chamber 130. The distribution of the upper bank of lamps 146 is unimpeded so that a regular sequence of lamps is provided across the lateral extent of the chamber 130. The lower bank of lamps 140, on the other hand, is provided on both sides of the shaft 140, but is discontinued in the region surrounding the shaft. One or more spot lights or directed lamps 150 are positioned under the chamber 130 and surrounding a downwardly depending quartz tube 152 formed integrally with the chamber 130. The tube 152 concentrically receives the shaft 140. The tube 152 and shaft 140 create an annular space therebetween which is used to inject a purge gas into a region underneath the susceptor 134. The purge gas flow is indicated by the arrows 154 in FIG. 11a. The directed lamps 150 radiate energy to the underside of the susceptor 134, which may be shadowed by the shaft 152 and supporting structure. The specific heating arrangement is similar to that described and illustrated in U.S. Pat. No. 4,836,138, which is hereby expressly incorporated by reference.

The upper and lower banks of lamps 146, 148 are distributed in a generally rectangular configuration above and below, respectively, the susceptor region 134. This arrangement, in combination with the directed lamps 150, focuses the radiant energy on the susceptor 134 and the associated wafer 144. In addition, the perpendicular orientation of the upper and lower banks 146, 148 further enhances uniformity of heating of the susceptor 134. An enlarged temperature compensation ring 155 is shown in FIGS. 11 and 11a, and its specific structure will be described in more detail below. It should be noted, however, that the peripheral shape of the modified temperature compensation ring 155 is generally rectangular and conforms to the projected columns of radiant heat from the upper and lower banks of lamps 146, 148. This arrangement is highly efficient and results in more uniform temperature across the susceptor 134.

A gas injector 156 is positioned upstream of the process chamber 130 and includes a plurality of reactant gas flow needle valves 158 for metering the reactant gas into the chamber through multiple ports. Reactant gas is metered through the injector 156 and thereafter passes through an inlet aperture 160 leading into an upper region 162 of the process chamber 130. The reactant gas flow is indicated by the arrow 164 in FIG. 11a. The gas flows across the susceptor 134 and wafer 144, above the inner support plate 132, and exits through an outlet aperture 166 in the process chamber 130. The exhaust path is indicated with the arrow 168. Along with the previously described upward purge flow 154, a longitudinal purge flow 170 is provided by the gas injector 156. More particularly, and as will be described in more detail below, the gas injector includes inner channels which open into a lower region 172 of the process chamber 130 through a purge inlet aperture 174. The purge gas flow 170 enters the lower region 172 and passes underneath the susceptor 134 and surrounding structure, and exits the lower region through a purge outlet aperture 176, as indicated with the arrow 178.

FIG. 11 illustrates a modified exhaust apparatus 180 which receives both the spent reactant gas flow 168 and the exhaust purge gas flow 178. More particularly, a common plenum chamber 182 receives the aforementioned gas flows and leads to an angled exhaust conduit 184 in communication with an exhaust manifold 186. The exhaust manifold 186 is attached to a suitable source of vacuum. The plenum chamber 182 is defined by a generally rectangular flange member 188 which is preferably water cooled with internal passages supplied with cooling fluid through pipes 190. Internal cooling of the flange member 188 helps prevent deterioration of elastomeric seals between the flange member and the process chamber 130.

Modified Temperature Compensation Ring

FIGS. 11, 11a and 12 illustrate the aforementioned modified temperature compensation ring 155 surrounding the susceptor 134. This ring 155 is similar in many respects to the ring 72' previously described with respect to FIG. 9. That is, the ring 155 is built outward to conform closely to the rounded rectangular aperture 194 formed in the support plate 132 of the chamber 130, but is spaced therefrom to avoid degradation of the quartz support plate 132. In one particular embodiment, as indicated in FIG. 11a, the modified temperature compensation ring 155 comprises a lower annular U-shaped channel member 196, and an upper planar member 198. The upper member 198 includes an opening which is centered over the channel member 196 through the use of one or more integrally formed downwardly depending centering rings 199, which can also be small projections spaced in a circular pattern circle. The lower member 196 supports a plurality of elongated of thermocouples which, as previously described, extend from a downstream end of the chamber 130 through the purge outlet aperture 176 and into the lower region 172, and the ring 155. The ring 155 includes openings in its downstream end for receiving the thermocouples.

There are preferably three thermocouples supported by the temperature compensation ring 155, all of which enter the chamber from the downstream end through the purge outlet aperture 176. The three thermocouples extend in parallel forward into the chamber underneath the support plate 132 and are spaced apart in the lateral direction. A middle thermocouple 199 is shown in FIG. 11a extending just underneath the support plate 132 and terminating downstream of the susceptor 134. A second thermocouple 200 enters the ring 155 and curls around a circular path defined by the channel member 196 to terminate at a leading edge position, as seen in FIG. 11a at the leading edge of the ring. A third thermocouple (not shown) also enters the ring 155 and curls halfway around the channel member 196 in the opposite direction from the second thermocouple 200 to terminate at a position midway between the leading and trailing edges of the susceptor 134. The combination of the three thermocouples thus senses temperature at the leading edge, trailing edge, and one side edge of the susceptor 134.

To enable the thermocouples to enter the channel member 196, its rear end is formed by an elongated L-shaped portion 202. This portion is absent an exterior wall to allow the thermocouples access to the interior of the channel. Although not shown, the L-shaped portion may extend around an arc sufficient in length to receive the three entering thermocouples, or may comprise discrete portions at the locations through which each thermocouple passes into the channel member 196.

The upper planar portion 198 has an inner edge which is sized approximately the same diameter as the inner wall of the channel portion 196 and closely conforms to but is spaced from the outer peripheral edge of the susceptor 134. An outer edge of the planar member 198 extends outwardly from the outer wall of the channel member 196 and conforms closely with the rounded rectangular aperture 133. Again, the ring 155 is preferably constructed of graphite having a large thermal mass to help insure temperature uniformity across the susceptor 134 and wafer 144. In alternative embodiments, however, the ring 155 may be constructed of a lower thermal mass, or even of quartz so that direct radiant heat from the banks of lamps 146, 148 and 150 can impinge on the edge of the susceptor 134.

With reference to FIG. 11a, an upstream gap 204 is defined between the ring 155 and the upstream section 135a of the support plate 132. Likewise, downstream gap 206 is formed between the downstream edge of the ring 155 and the downstream section 135b of the support plate 132. The upstream gap 204 is sized slightly smaller than the downstream gap 206. The process gas which passes across the susceptor 134 and wafer 144 is relatively cool toward the inlet end of the chamber 130. As the process gas passes over the hot ring 155 and susceptor 134, it heats up to a maximum temperature at the trailing edge of the wafer. The ring 155 is thus subject to a higher temperature in the environment of the processing chamber at its downstream edge, as opposed to its upstream edge. Because the quartz is relatively fragile and will deteriorate upon repeated thermal cycling, the gap 206 is made slightly larger at the downstream edge of the ring 155 to prevent excessive heating of the quartz by the ring 155 at that location. In one embodiment, the upstream gap 204 is about 4 millimeters, while the downstream gap 206 is about 5 millimeters.

Sacrificial Quartz Plate

The process chamber 130 of FIG. 11 further incorporates a sacrificial quartz plate 210 to protect the upstream edge of the aperture 133. As seen in FIGS. 12–14, the sacrificial quartz plate 210 comprises a horizontal planar portion 212 and a vertical curvilinear lip 214. The horizontal portion 212 further includes a large central aperture 216 which is sized to receive the drive shaft 140 and hub 138. The horizontal portion 212 extends underneath the susceptor 134 and is supported by three fingers 218 depending from below the central support plate 132. The fingers 218 are much like the support fingers 80 and 82 described previously with respect to the first chamber embodiment. More particularly, a front finger 218a is centrally disposed across the lateral width of the upstream section 135a of the central support plate 132. A pair of downstream fingers 218b are spaced laterally from the center of the support plate in its downstream section 135b. The approximate location of these fingers are best seen in the exploded view of FIG. 12.

The horizontal portion 212 of the sacrificial quartz plate 210 includes two rearward extensions 220 having rectangular areas 221 of reduced thickness and apertures 222 therein. The thin areas 221 of the extensions 220 are sized to fit on the downstream fingers 218b, as seen best in FIG. 11a. The apertures 222 are sized to receive support pins 224 also supported on the fingers 218b. The pins 224 extend through the apertures 222 and are used to support the temperature compensation ring 155. A thinned area 230 and forward aperture 226 is also provided in the horizontal portion 212 for receiving a support pin 227. The front finger 218a fits in the thinned area 230 and supports the front end of the sacrificial quartz plate 210, as well the front end of the ring 155 via the pin 227. The thinned areas 221 and 230, and more particularly the side walls formed thereby, in combination with the apertures 222 and 226 and pins 224 and 227 retain the plate 210 in position with respect to the fingers 218a,b.

The quartz plate 210 has a generally constant lateral cross-sectional width which diverges at a forward end to a wider region 228. The wide region 228 includes rounded forward corners which conform to the shape of the aperture 133. The vertical lip 214 extends upward from the rounded edges of the forward portion 228 into proximity with the rounded rectangular edges of the aperture 133. This is seen best in FIG. 11a. The vertical lip 214 thus conforms closely with the inner edge of the support plate 132 at the aperture 133, and protects the quartz from devitrification at this location. Preferably, the vertical lip 214 contacts the quartz of the aperture 133.

The shape of the sacrificial quartz plate 210 is seen in plan view and cross-section in FIGS. 13 and 14, respectively. It will be noted that the thickness of the plate 210 is greater in the middle portion and thinner at the areas 221 and 230 which, as mentioned, receive and retain the fingers 218a,b. Furthermore, the vertical lip 214 is noticeably thinner than the horizonal portion of the plate 210. In one specific embodiment, for use in a reaction chamber for processing wafers of 200 millimeter diameters, the sacrificial quartz plate 210 has an overall longitudinal dimension of approximately 11.2 inches. The width of the plate 210 is approximately 7.45 inches, and the outwardly diverging edges in the region 228 form a 30° angle with the side edges. The width of the forward region 228 is approximately 10.16 inches. The curvature of the forward edges which conform closely with the inner edge of the aperture 133 is approximately 2.25 inches in radius. The plate has a thickness of approximately 0.2 inches over a majority of its cross-section, but the regions receiving the fingers 218 having a thickness of approximately 0.06 inches. The vertical lip has a height of approximately 0.99 inches, while its thickness is approximately 0.04 inches (1 millimeter).

Figure 15:
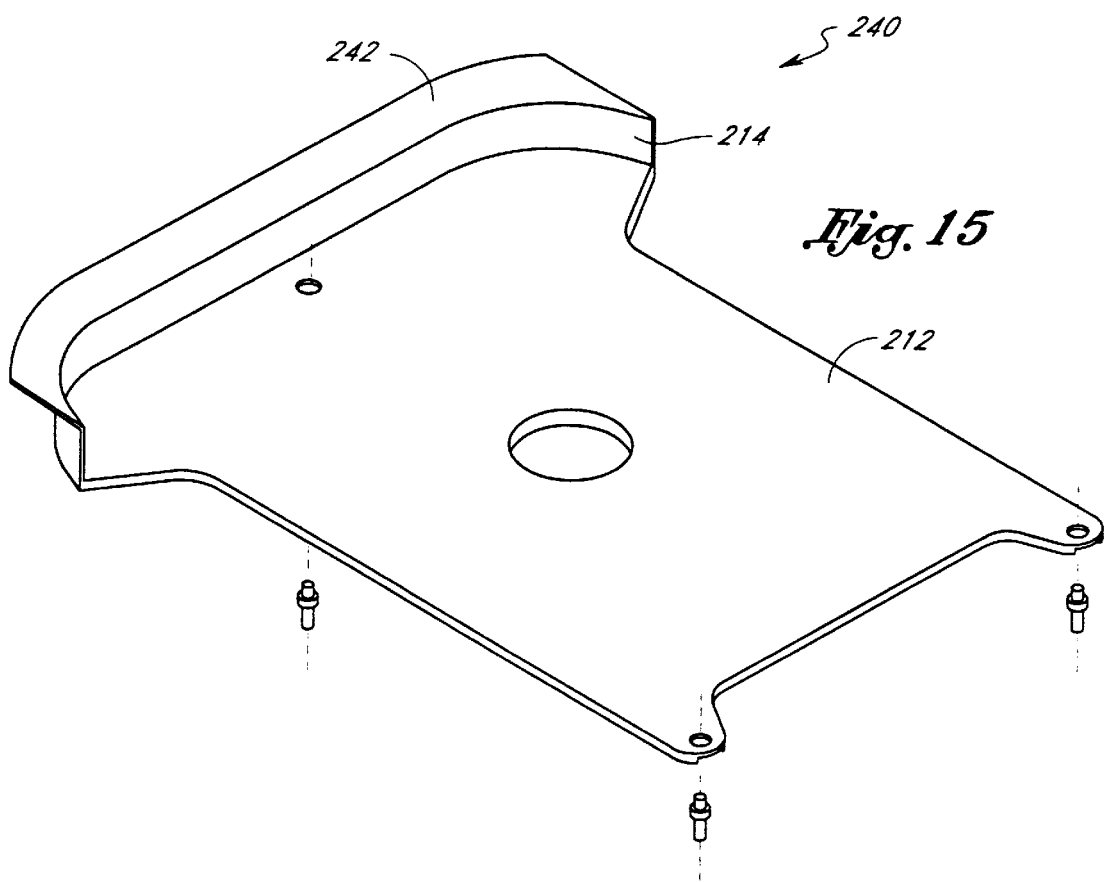
FIG. 15 is a perspective view of an alternative sacrificial quartz plate for use in the chamber of the present invention.
Figure 16:
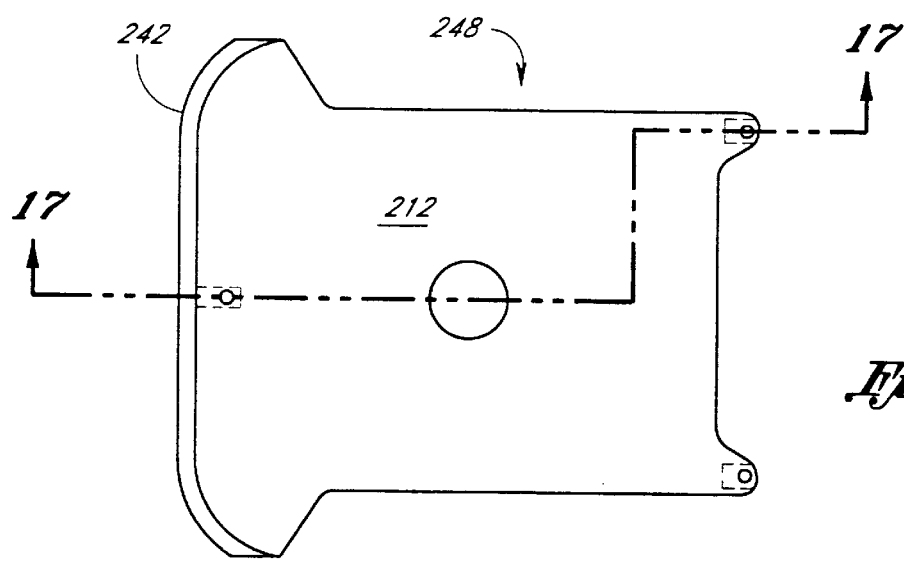
FIG. 16 is a top plan view of the sacrificial quartz plate of FIG. 15.
Figure 17:
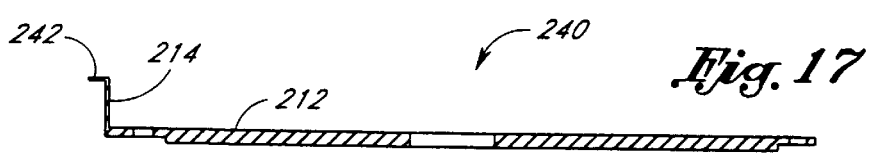
FIG. 17 is a cross-sectional view taken through the sacrificial quartz plate of FIG. 16.

FIGS. 15–17 illustrate a modified sacrificial quartz plate 240 which is in most respects identical to the quartz plate 210 previously described. In contrast, however, the quartz plate 240 includes a horizontal extension 242 formed at an upper edge of the vertical lip 214. The horizontal extension 242 extends forwardly from the lip 214 and is intended to rest on the upper surface of the central support plate 132. That is, the vertical lip 214 extends upward as seen in FIG. 11*a* in close proximately with the aperture 133, and the horizontal extension 242 extends over the upper corner of the aperture. This arrangement further protects the quartz of the central support plate 132 from devitrification. In other respects, the modified quartz plate 240 is identical to the quartz plate 210 previously described, and is supported by the fingers 218*a,b* underneath and parallel to the susceptor 134.

Figure 18A:
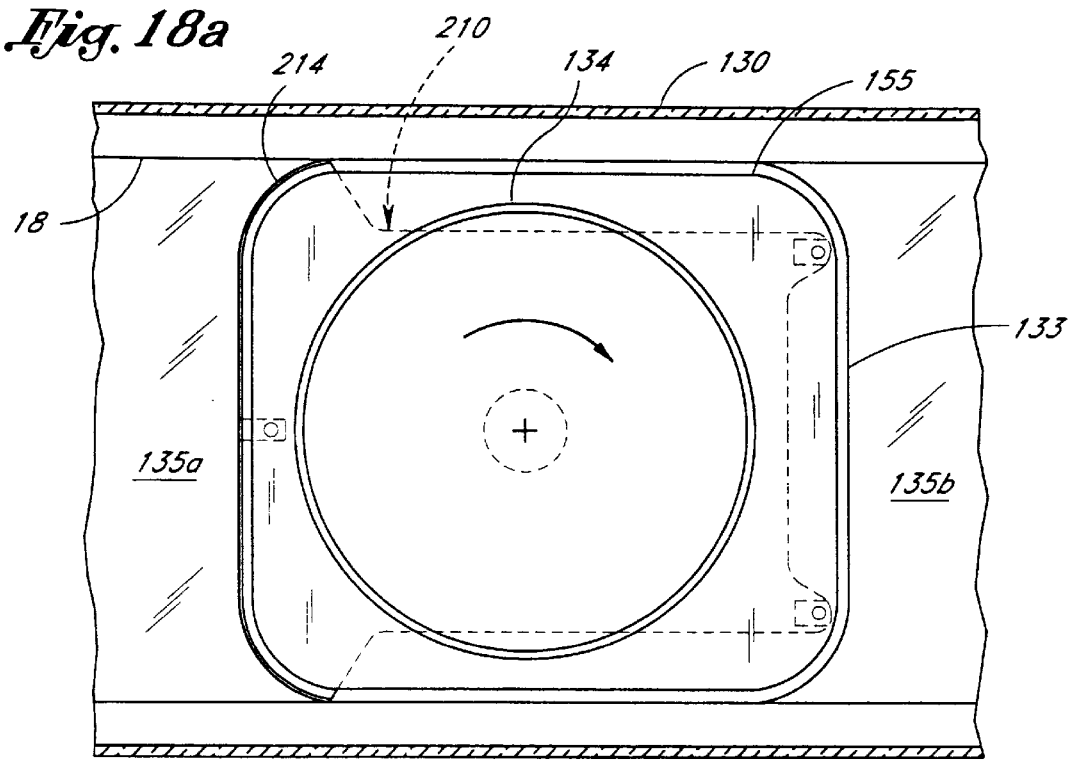
FIG. 18a is a top plan view taken along line 18—18 of FIG. 11, showing the sacrificial quartz plate of FIG. 13 installed in the chamber of the present invention.
Figure 18B:
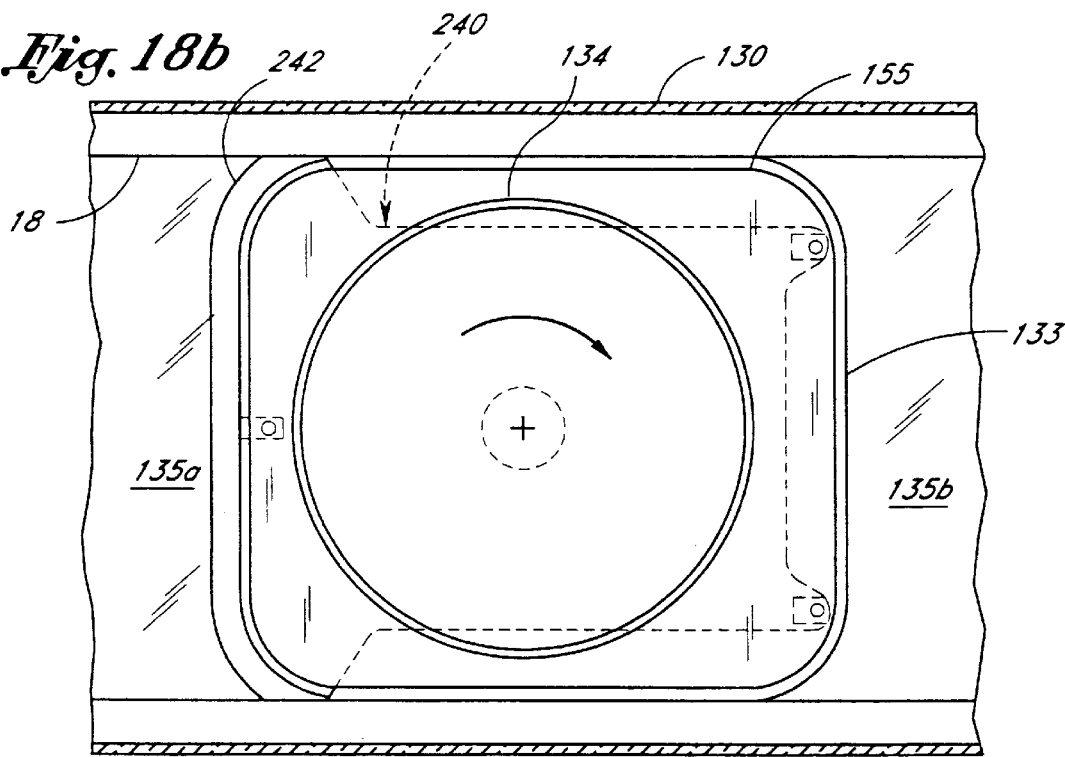
FIG. 18b is a top plan view showing the sacrificial quartz plate of FIG. 15 installed.

FIGS. 18*a* and 18*b* illustrate the sacrificial quartz plates installed surrounding the susceptor 134. More particularly, as seen in FIG. 18*a*, the sacrificial quartz plate 210 is seen in phantom underneath the susceptor 134, with the vertical lip 214 visible at the downstream edge of the front section 135*a* of the central support 132. It will be seen that the vertical lip 214 extends laterally around the sides of the aperture 133 to terminate at the side rails 18 of the chamber 130, previously described. FIG. 18*b*, on the other hand, illustrates the horizontal extension 242 extending forwardly from the edge of the aperture 133. Again, the sacrificial quartz plate 240 is positioned underneath and parallel to the susceptor 134.

Figure 18C:
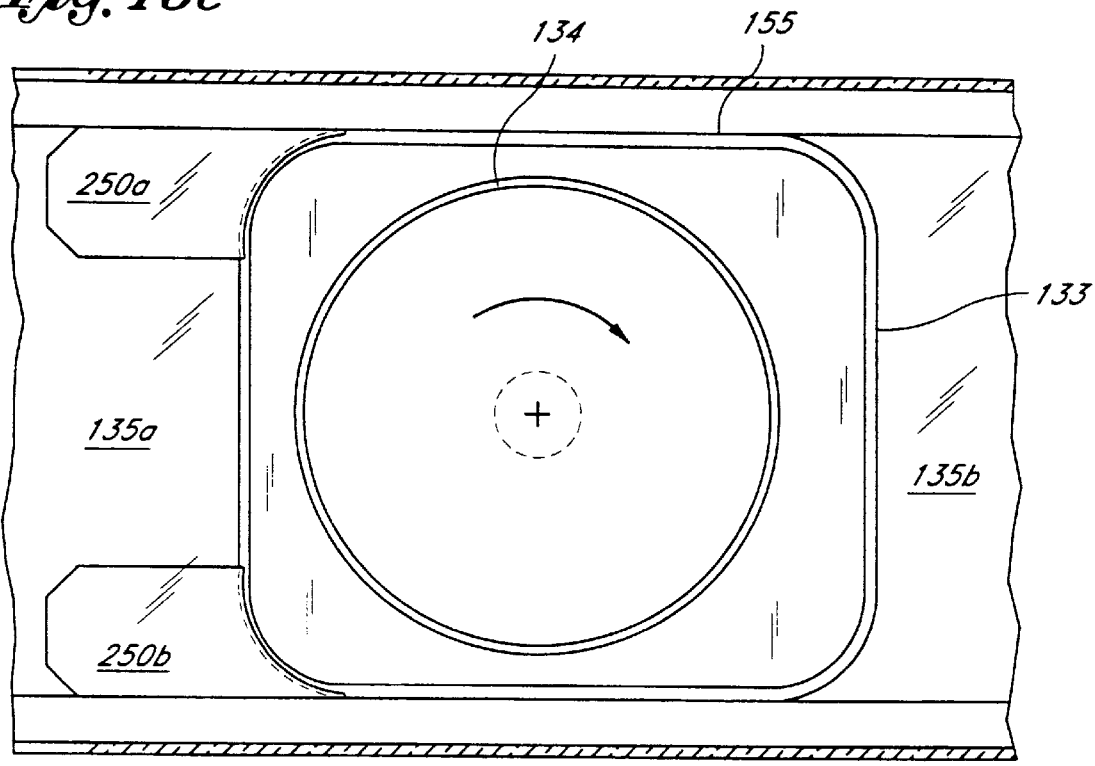
FIG. 18c is a top plan view showing a pair of discrete sacrificial quartz plates at upstream corners of the chamber support plate aperture.
Figure 19:
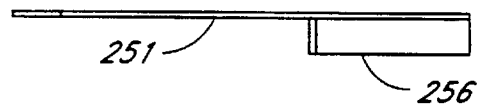
FIG. 19 is a side elevational view of one of the discrete sacrificial quartz plates shown in FIG. 18c.
Figure 20:
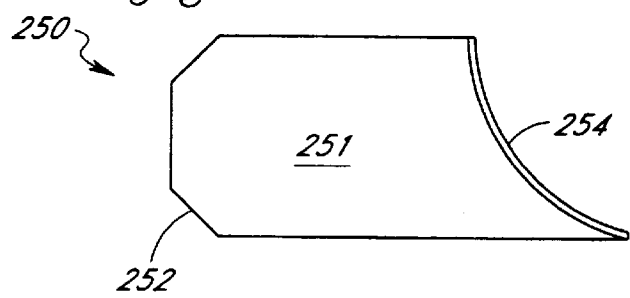
FIG. 20 is a bottom plan view of the discrete sacrificial quartz plate of FIG. 19.

In a further embodiment, as seen in FIGS. 18*c*, 19 and 20, a pair of discrete sacrificial quartz plates 250*a* and 250*b* may be positioned on the central support plate 132. The discrete plates 250 are shown in plan view in FIG. 19 and have a generally rectangular shape with a pair of chamfered edges 252 on an upstream end and a curvilinear downstream edge 254. As seen in FIG. 20, a vertical lip 256 projects downwardly from the curvilinear edge 254. The curvilinear edge 254 is sized to conform closely with the curved corners of the rounded rectangular aperture 133. In this respect, and as seen in FIG. 18*c*, the discrete sacrificial quartz plates 250*a,b*, are positioned at the rounded corners of the aperture 133. The downwardly depending lip 256 thus protects the corners of the aperture 133 from devitrification. The corners of the aperture 133 are subject to the greatest stresses during vacuum processing, and thus will suffer most from repeated thermal cycling. Thus, the provision of the discrete plates 250*a,b* protects these corners, and can be replaced relatively easily. The plates 250*a,b* are simply placed on the central support plate 132 without other fastening means. Of course, a single sacrificial quartz plate combining the discrete plates 250*a,b* is envisioned which can also be placed directly on top of the central support plate 132.

Gas Injector

Figure 21:
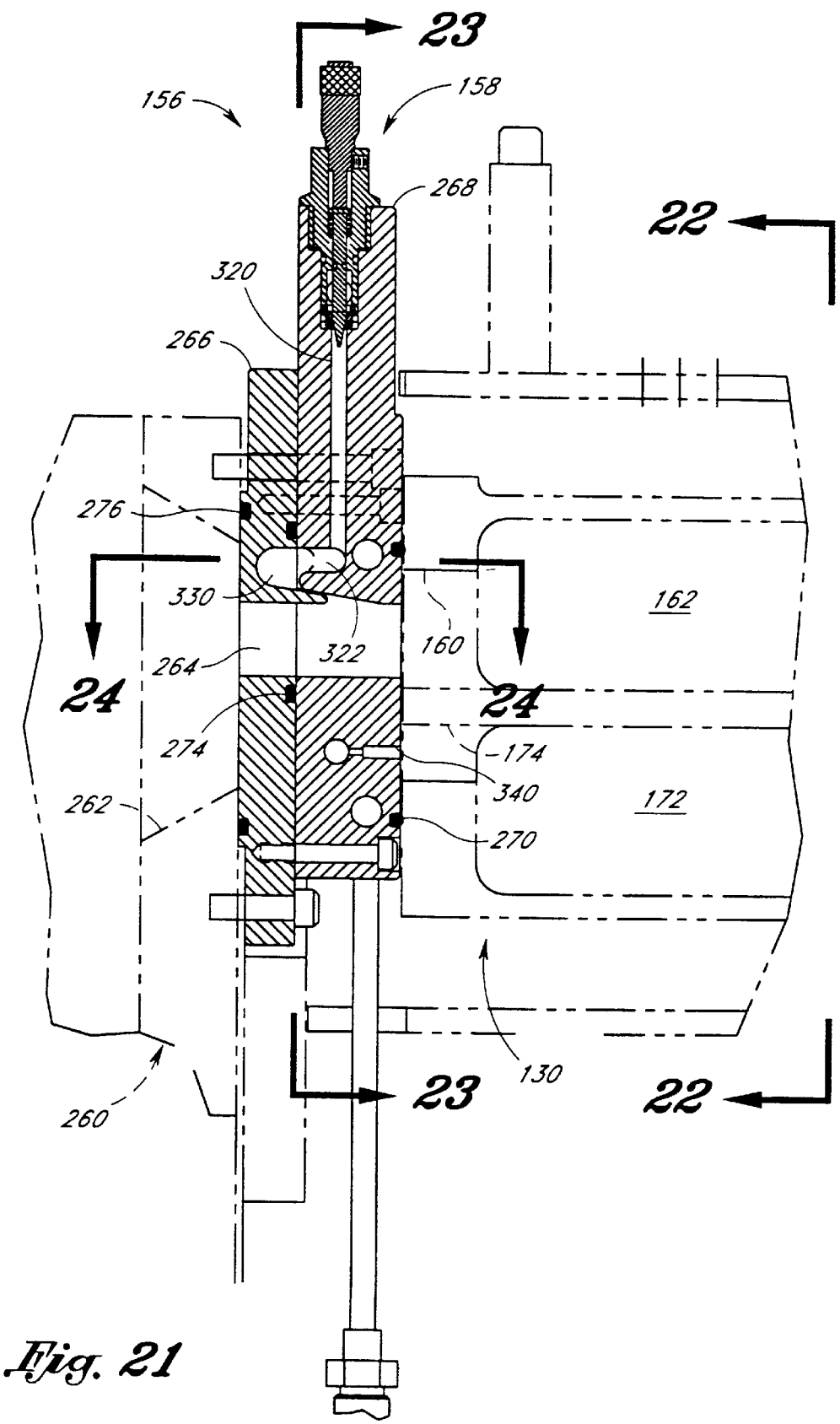
FIG. 21 is a vertical cross-sectional view of a gas injector having multiple tuned ports for use in the chamber of the present invention.
Figure 21A:
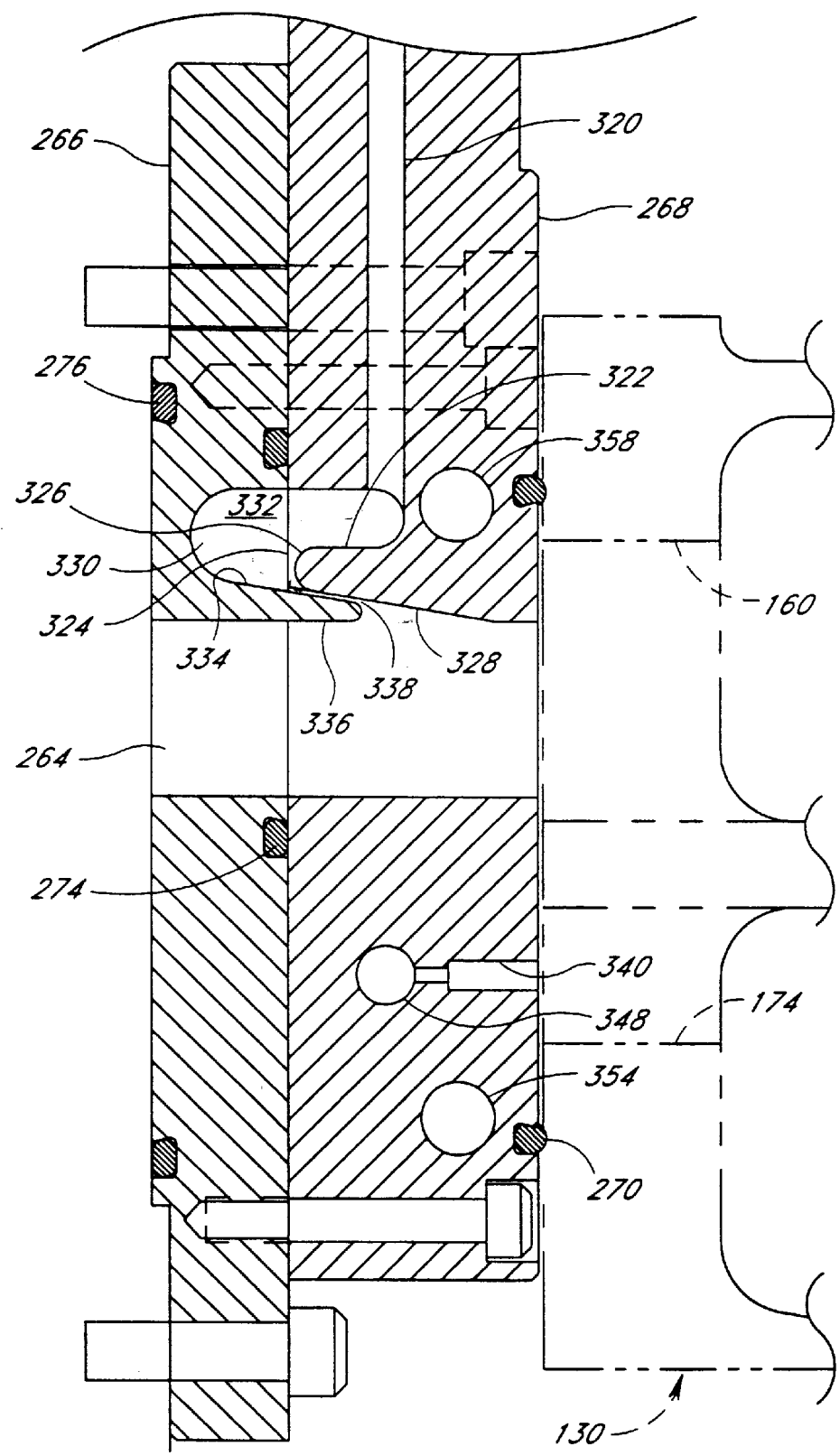
FIG. 21a is a detailed cross-sectional view of a portion of the gas injector showing process gas flow chambers.

FIG. 21 illustrates the gas injector 156 previously mentioned with regard to FIG. 11. The gas injector 156 comprises a generally vertical two-part flange member which abuts the upstream end of the quartz chamber 130. More particularly, the gas injector 156 is sandwiched between a wafer handling chamber 260 (shown in phantom) and the process chamber 130. Suitable pneumatic pressure is provided by one of various means known to those skilled in the art to secure the intimate contact between the gas injector 156 and chamber 130.

The wafer handling chamber 260 includes a tapered wafer delivery port 262 leading to a horizontal wafer/gas entry slot 264 defined by the gas injector 256. A wafer handler (not shown) delivers wafers through the delivery port 262 and entry slot 264 to and from the handling chamber 260 and process chamber 130. In one embodiment, the wafer handler comprises a low-profile Bernoulli-type pickup wand which fits through the entry slot 264 carrying the wafer on an underside. Of course, other low-profile pickup wands may be used. In this respect, the entry slot 264 has a height of approximately 0.75 inches, and a length through the gas injector 156 of about 1.56 inches. With reference to the rear view of FIG. 22, the entry slot 264 extends laterally across a majority of the width of the gas injector 156, and is desirably about 9 inches wide for enabling passage of 200 mm diameter wafers. Those of skill in the art will recognize that the dimensions noted herein will be modified to accommodate wafers of larger size, such as those with 300 mm diameters.

As described in U.S. Pat. No. 4,828,224, which is hereby expressly incorporated by reference, a gate valve is preferably mounted in the handling chamber for reciprocal movement alternately closing and opening the delivery port 262. In one particularly advantageous form, the gate valve includes a pivoting body which also has a wafer passage therethrough, the passage being in line with the delivery port 262 when the valve is opened. One solid surface of the gate valve includes an O-ring adapted to seal against the front face of the gas injector 156 for isolating the environments of the handling chamber 260 and process chamber 130 from each other.

The gas injector 156 is formed from a front flange half 266 and a rear flange half 268. The front and rear flange halves 266, 268 are generally vertically disposed plate-like members arranged to mate against one another. More specifically, the front face of the front flange half 266 is adapted to mate against the wafer handling chamber 260, and its rear face abuts against the front face of the rear flange half 268. Further, the rear face of the rear flange half 268 mates against the process chamber 130. O-ring seals are provided between these elements to prevent gas leakage from, or contamination of, the wafer handling regions. A generally oval shaped chamber O-ring 270, best seen in FIG. 22, is provided between the gas injector 156 and chamber 130. More specifically, the rear flange half 268 includes a continuous groove 272 (FIG. 25) in its rear face surrounding the entry slot 264 which receives the chamber O-ring 270. The chamber O-ring 270 abuts the flat front face of the process chamber 130 and surrounds the inlet apertures 160, 174 leading to the upper and lower regions 162, 172, respectively. An intermediate O-ring 274 is provided in a groove in the rear face of the front flange half 266 and seals the entry slot 264 at the junction between the front and the rear flange halves 266, 268. Finally, a handling chamber O-ring 276 is provided in a groove in the front face of the front flange half 266 which seals the entry slot 264 at the interface between the gas injector 156 and the wafer handling chamber 260.

Figure 23:
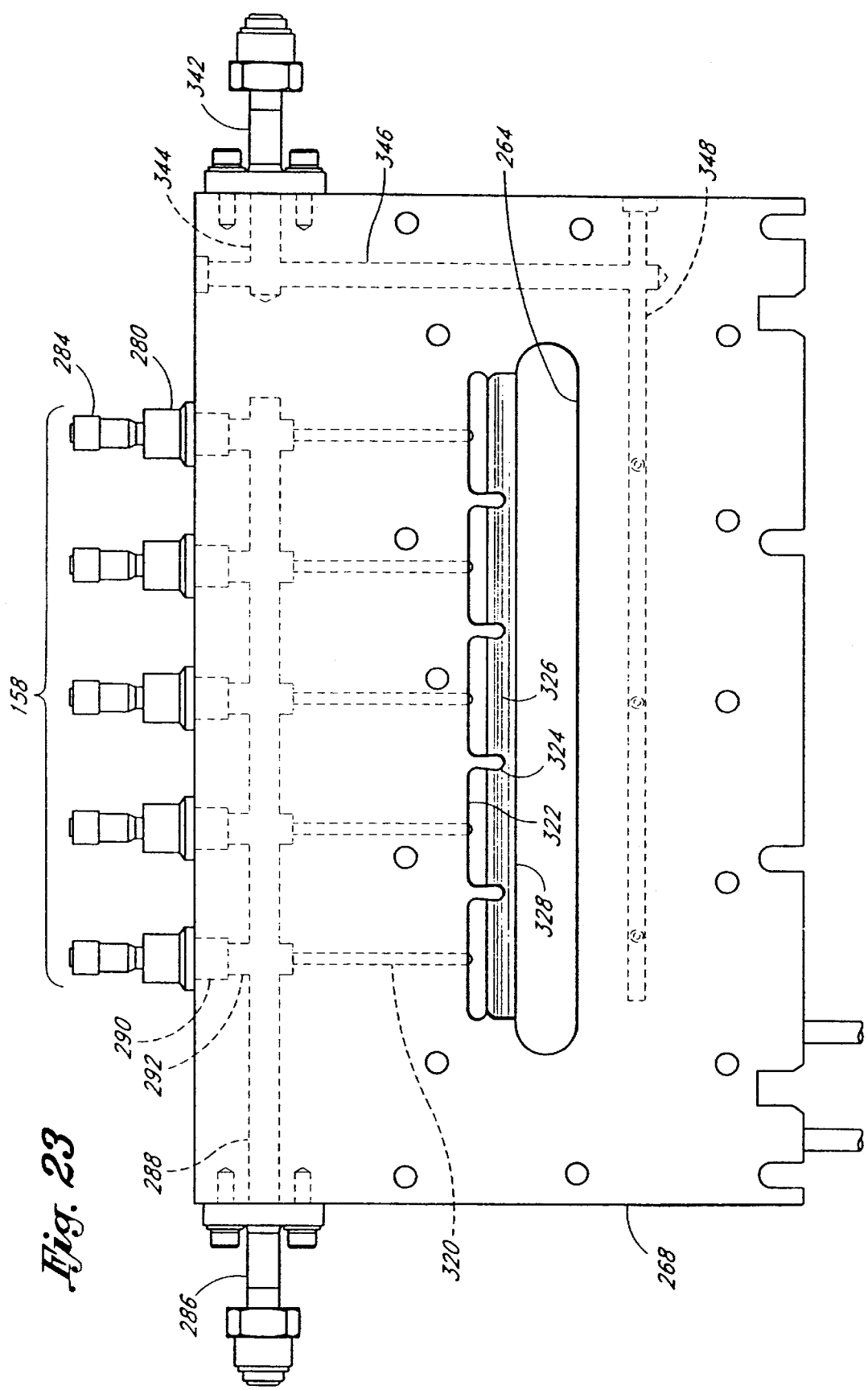
FIG. 23 is a front elevational view of a rear flange half of the gas injector taken along line 22—23 of FIG. 21.

As viewed in FIGS. 22 and 23, a plurality of the needle valves 158 are distributed across the top edge of the rear flange half 268. Preferably, there are five such needle valves 158 distributed evenly and centered in the rear flange half 268. Each of the needle valves 158 comprises a tubular cartridge 280 secured into an upwardly opening stepped cavity 282 (FIG. 26), and thumbscrews 284 for adjustment of gas flow through the gas injector 156. In this respect, process gas enters through an inlet conduit 286 in one lateral edge of the rear flange half 268 and is distributed through the gas injector 156 eventually entering the process chamber 130 through the entry slot 264.

Figure 26:
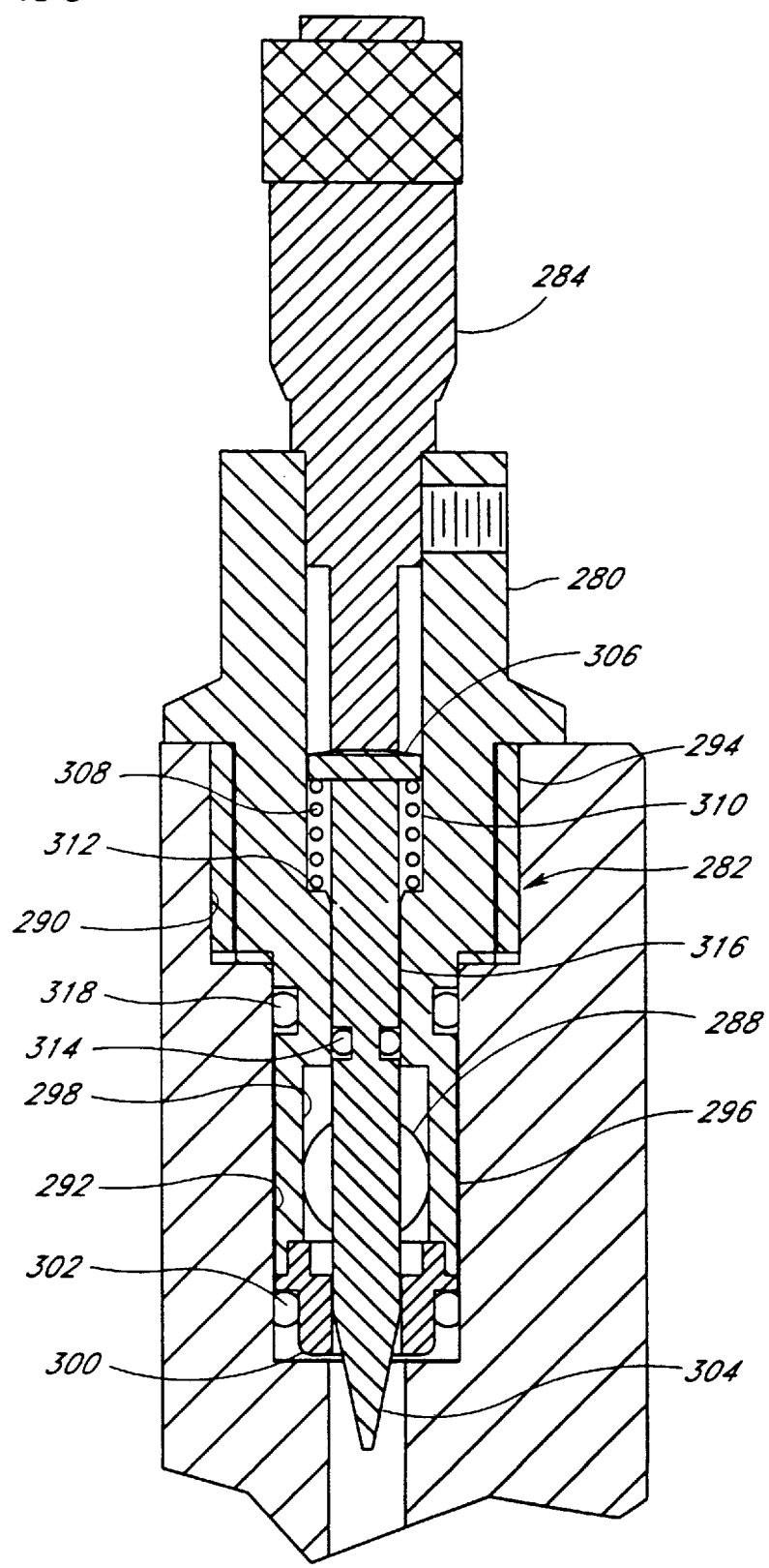
FIG. 26 is an enlarged cross-sectional view of a needle valve used in the gas injector of the present invention.

The process gas enters at the inlet conduit 286 and flows through a horizontal plenum 288 extending laterally across the rear flange half 268 underneath the five adjustment thumbscrews 284. As best seen in FIG. 26, each cartridge 280 is fixed within an upper threaded bore 290 of the cavity 282, which cavity also defines a reduced diameter valve bore 292. Each of the valve bores 292 is in fluid communication with the horizontal plenum 288. Each cartridge 280 includes an outer threaded portion 294 for mating with the threaded bore 290, and a lower reduced diameter portion 296 for receiving and channeling process gas. More particularly, the reduced diameter portion 296 includes a horizontal slot 298 at the height of the plenum 288 which allows process gas to freely flow along the plenum to each cavity 282. Gas which enters trough the inlet conduit 286 thus fills the plenum 288 to an equal pressure across its width.

A valve seat 300 separate from the cartridge 280 is positioned at the bottom end of the valve bores 292 and is sealed on its exterior against the valve bore with an O-ring 302. Each thumbscrew 284 is axially aligned with and abuts a needle 304 which extends downward through the hollow cartridge 280 and into engagement with an inner sealing surface on the valve seat 300. Midway along the needle 304, an annular needle collar 306 provides a reaction surface against which a spring 308 acts. The spring 308 is positioned within an upper cylindrical bore 310 of the cartridge and abuts a reduced diameter step 312. The needle 304 is thus biased upward into engagement with the thumbscrew 284. The spring 308 enables precise positioning of the needle 304 with respect to the cartridge 280. That is, the needle 304 has a slip fit within the bore of the cartridge 280 and is biased by the spring 308 against the thumbscrew 284 which provides an adjustable stop. Additionally, the spring rate of the spring 308 is sufficient to resist downward movement of the needle 304 during vacuum processing.

The cartridge 280 is provided with gradations around its periphery and with the rotatable thumbscrew 284 functions similar to a micrometer. Axial travel of the thumbscrew 284 and needle 304 within the cartridge 280 alternately engages and separates the valve surfaces between the lower end of the needle and the valve seat 300. A second smaller O-ring 314 is provided around the needle 304 and acts against a reduced diameter bore 316 below the upper bore 310 in the cartridge 280. This prevents process gas from traveling upward around the needle 304. A third O-ring 318 is positioned in a groove formed in the exterior of the cartridge 280 and acts against the valve bore 292 to prevent process gas escaping upward around the cartridge.

With reference to FIG. 22, a narrow conduit 320 extends downward below the valve bore 292 into communication with an expansion chamber 322, best seen in FIG. 24. Looking also at the front face of the rear flange half 268 in FIG. 23, each expansion chamber 322 is formed as a horizontal slot and diverges outward at a rear end below the conduit 320 to a front end facing the rear flange half 266. The expansion chambers 322 are segregated by flow dividers 324. There are five such expansion chambers 322 formed with flow dividers 324 provided therebetween.

The front lower end of each expansion chamber 322 terminates in a rounded lip 326, seen in profile in FIG. 21. The lip 326 projects forward and stops just short of the plane defined by the front face of the rear flange half 268; which also defines an interface plane between the flange halves. The dividers 324 project forward to the interface plane and terminate at the forwardmost point of the rounded lip 326, as seen in FIG. 23. The lip 326 continues rearward from the flow dividers 324, rolling underneath the expansion chambers 322 in a common planar angled surface 328. The angled surface 328 continues down and rearward as seen in FIG. 21 until it intersects the entry slot 264.

Looking at FIG. 21, the front flange half 266 includes a series of recesses 330 formed in its rear face opposing the expansion chambers 322. The recesses 330 have narrow walls 332 separating each other which are depicted in phantom in FIG. 22 and seen in cross-section in FIG. 24. Each recess 330 has an elongated, generally semi-cylindrical shape and a lower wall 334 which angles downward and rearward, continuing as a lip 336 projecting underneath the angled surface 328 of the rear flange half 268. The narrow walls 332 terminate at the interface plane while the lip 336 extends rearward therefrom. The angled surface 328 above and the lip 336 below together define a narrow gas flow slit 338 having a width approximately equal in width to the width of the five expansion chambers 322 combined.

Process gas is metered at the needle valves 158 and travels downward through the conduits 320 into the expansion chambers 322 where the gas flow diffuses outward to slow its velocity. The five slower moving streams of process gas then flow generally forward across the interface plane and are turned nearly 180° by the curved walls of the recesses 330 to be directed through the narrow slit 338, which shapes the flow into a sheet-like ribbon. The flow metered through each of the five needle valves 158 is kept separate within each of the expansion chambers 322 by the flow dividers 324, and within each of the recesses 330 by the walls 332. The five separate flows are allowed to mix through the slit 338 to result in the single planar ribbon. This gas flow sheet continues downward and rearward into the entry slot 264 and thereafter generally horizontally through the process chamber 130, primarily due to a decreasing pressure gradient along the chamber in the direction of the source of vacuum downstream from the exhaust apparatus 180. During process gas flow the forward end of the entry slot 264 is closed by provision of the gate valve previously mentioned to prevent flow in the opposite direction. The mixing of the flow commences at a significant distance upstream of the wafer leading edge so as to provide adequate distance and time for the separate streams of flow to blend together by diffusion, thereby smoothing the gas density profile laterally across the wafer.

As seen in FIG. 22, the gas injector 156 is further provided with purge gas channels and three purge gas apertures 340 opening into the lower region 172 of the process chamber 130. In this respect, process gas flows through the entry slot 264 and inlet aperture 160 into the upper region 162 of the chamber 130, while purge gas flows through the three apertures 340 and purge inlet aperture 174 into the lower region 172 of the chamber. A purge gas inlet 342 is provided on the lateral edge of the rear flange half 268 opposite the process gas inlet conduit 286. The inlet 342 leads to a short horizontal passage 344 connecting with a vertical passage 346. A horizontal purge gas plenum 348 distributes the purge gas in equal pressures to the apertures 340. Purge gas is thus channeled through the gas injector 156 and exits through the three evenly spaced apertures 340 which are positioned underneath the entry slot 264 and below the central support plate 130 when the gas injector abuts the process chamber 130.

Figure 24:
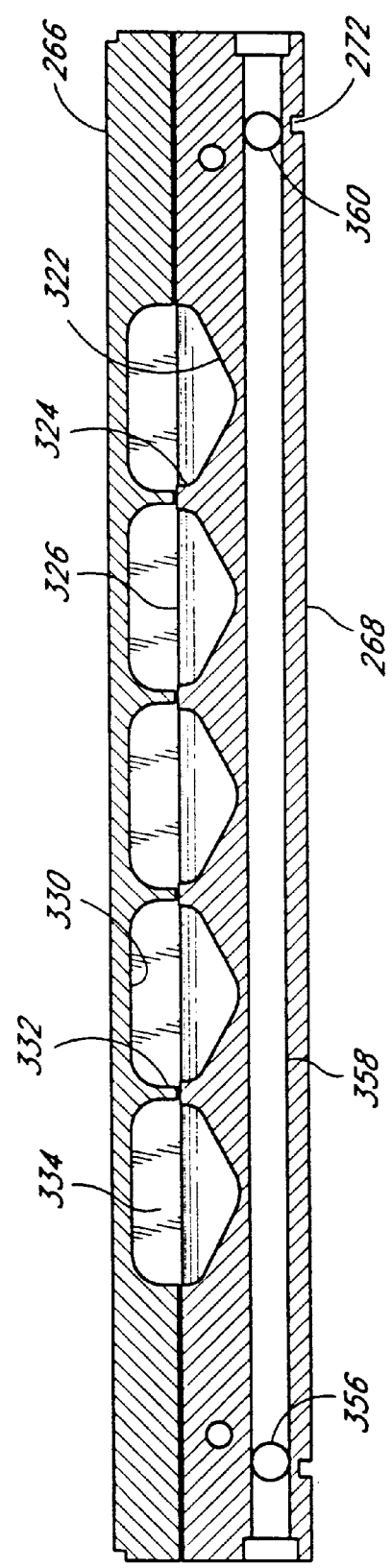
FIG. 24 is a horizontal- cross-section of the gas injector taken along line 24—24 of FIG. 21 showing a region in which processed gas is expanded.
Figure 25:
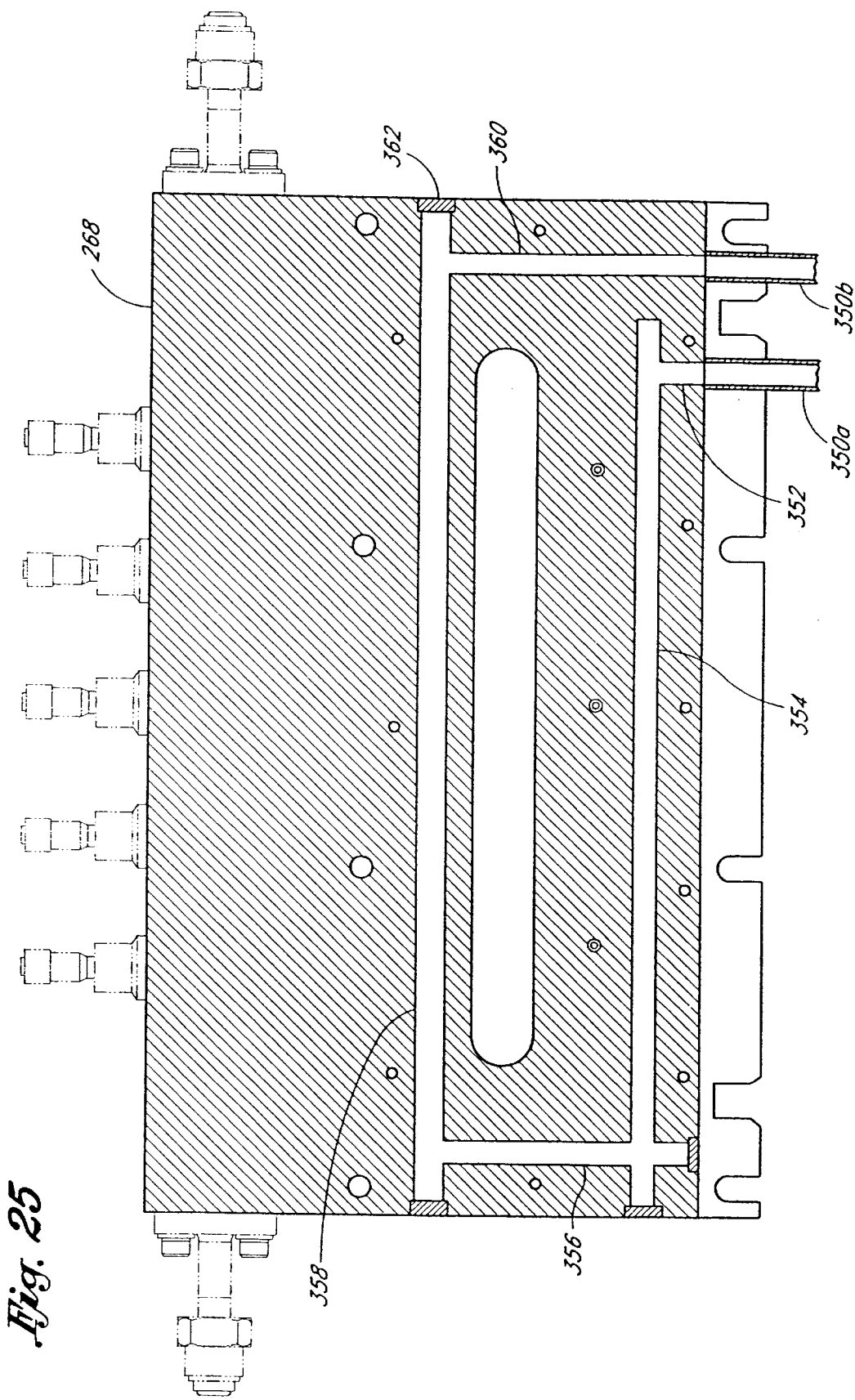
FIG. 25 is a vertical cross-sectional view through the rear flange half taken along line 25—25 of FIG. 21 showing internal fluid cooling channels.

With reference to FIGS. 21, 24 and 25, the gas injector 156 also includes water cooling channels therein for protection of the chamber O-ring 270. More particularly, a pair of lower conduits 350a, 350b provide cooling water flow into and out of the gas injector 156. The internal cooling channels within the gas injector 156 are shown best in the cross-section of FIG. 25. Cooling water enters through the conduit 350a and travels upward through a short section or passage 352 into an elongated horizontal lower passage 354. This passage 354 connects with a vertical side passage 356 and, thereafter, with an elongated horizontal upper passage 358. Finally, a second side passage 360 extends from the upper passage 358 downward to the cooling outlet 350b. It will be seen that each of these passages are drilled into the solid rear flange half 268 and plugs 362 are provided at each of their exterior ends. The pattern of the passages conforms closely with the shape of the chamber O-ring 270. Furthermore, the passages are provides in the rear flange half 268 at a location proximate the O-ring 270, with a minimum of solid material therebetween, as best seen in FIGS. 21 and 24. The cooling flow through the passages is intended to maintain the temperature of the material of the gas injector 156 proximate the chamber O-ring 270 at approximately 60° F. or cooler. The cooling fluid used is preferably a Ph balanced mineral-free water which is introduced at room temperature or less. The gas injector elements are preferably manufactured of stainless steel and the mineralfree water prevents build-up of deposits which may impede the passage of cooling water.

The presently adjustable gas injector 156 greatly improves the efficiently of gas flow through the process chamber 130. Specifically, many previous gas injectors generated a fixed flow pattern or were inconvenient to adjust. Therefore, when gas flow was less than optimum, such as when recirculations were evident from deposition on the chamber walls, the entire gas injector had to be disassembled to adjust the gas flow therethrough. In the present gas injector 156, the thumbscrews 284 provide adjustability across the lateral width of the chamber. If recirculations are observed by a build-up of particulates on one wall of the chamber or the other, the gas flow at that side is adjusted higher. Often manufacturing tolerances in the assembly of the gas injector prevent precise correlation between the settings of the thumbscrews 284 and gas flow past the five needle valves. If the tolerances were perfect, the thumbscrews could be set at specific values relative to the micrometer gradations on the cartridge 280 and the flow rate would be predictable from those values. However, the tolerances are less than exact and the adjustability of the needle valves greatly speeds processing.

Although the various laterally distributed gas flows are independently metered in the gas injector 156, the aggregate output from the injector is a single sheet of flow in which the longitudinal boundaries of the flows are allowed to mix well upstream of the wafer leading edge. So as to enhance the uniformity of deposition by avoiding distinct boundaries between the flows.

In one particular embodiment, the micrometers are opened specific distances to allow gas flow between the needles 304 and the valve seat 300. The outer two needle valves 158 are opened by 1.5 millimeters, the second two needle valves are opened by 1.7 millimeters, and the center needle valve is opened by 2 millimeters. This symmetric pattern is preferred for a symmetric gas flow through the process chamber 130. If, subsequently, observation shows that recirculations are occurring within the chamber, this indicates the gas flow is not symmetric despite the readings of the thumbscrews. In this situation, one or more of the thumbscrews are adjusted to increase the flow on one lateral side of the chamber.

A typical total process gas flow is approximately 16 slm. This gas flow is reduced by approximately 20% over the gas flow in rectangular process chambers of the same height. This is due to the lenticular shape of the chamber. Typical gas pressure is 20 psi prior to passing through the needle valves.

The chamber pressure may be at a vacuum of approximately 80 torr. Conventional process gases are, for example, dychlorosilane and trichlorosilane. Of course, the process or doping gases are mixed with a carrier, typically hydrogen, at a ratio of approximately 9 to 1 carrier to process gas. In addition, purge gases such as nitrogen are often injected through the gas injector to clean out the various channels. Further, etched gases such as hydrogen chloride are used to clean out the channels. The typical purge gas flow through the gas injector into the lower region of the chamber is hydrogen at a flow rate of between 5 and 15 slm. Of course, nitrogen or other such inert gases may be substituted.

The present gas injector 156 provides a minimum amount of dead space volume within to enable faster and sharper transitions between different gases. That is, in some processing sequences, a first dopant gas is introduced through the gas injector into the chamber followed by a second dopant gas. At the transition between the introduction of the two gases, the first gas sometimes lingers within the gas injector. The present injector 156, on the other hand, has very small internal channels with minimal dead space so that, upon introduction of an intermediate inert gas, or the second dopant gas directly, the first dopant gas is immediately flushed out.

Downstream Extended Temperature Compensation Ring

FIG. 27 illustrates a CVD parallel flow process chamber 370, similar to the process chamber 130 shown in FIG. 11, having a susceptor 372 for supporting wafers in a process gas flow. As before, process gases enter through an inlet 374 and exit through an exhaust 376 in the chamber, flowing in a direction parallel to the plane of the susceptor. Upper and lower banks of radiant heat lamps 378a, 378b are positioned adjacent the chamber. It will be noted that the banks of lamps 378a,b extend farther downstream than the banks of lamps described for the embodiment of FIG. 11. Other arrangement of heat lamps may be used.

The present invention as shown in FIG. 27 introduces a downstream structure in the chamber with the goal of altering the temperature, velocity, direction, and composition of the gas flow. Furthermore, the temperature of the process chamber wall downstream of the wafer and the susceptor is elevated by this downstream structure, which improves the etching efficiency of the chamber.

In one particular embodiment, a temperature compensation ring 380 is provided surrounding the susceptor 372 which in most respects is identical to the ring 155 of FIG. 11. In contrast to the previous ring 155, which extended downstream to the edge of the rounded rectangular aperture 133 of the support plate 132, a top plate 382 of the ring 380 extends substantially farther. To accommodate this extension, a support plate 384 in the chamber 370 includes a susceptor aperture having a downstream edge 386 which, at a centerline of the chamber, is approximately one half of the way between the susceptor 372 and exhaust 376.

Desirably, the downstream edge of the top plate 382 of the ring 380 conforms to the shape of the aperture and terminates in close proximity to the aperture, as seen in FIG. 27. As will be described below, the benefits of the extended ring 380 must be balanced against a concern for the reduction in strength of the chamber 370 from a reduced size inner support plate 384. That is, for example, there is a benefit from the mass of the downstream structure which absorbs radiant heat and reflects that heat back to the chamber walls. In this respect, the more material downstream the better. Too large a ring 380, on the other hand, may compromise the strength of the entire chamber 370 in vacuum processing as the material of the support plate 384 is reduced. In one embodiment, the top plate 382 may have a rounded rectangular downstream edge similar to that of the modified temperature compensation ring 72' shown in FIG. 9, although the top plate may be formed in circular or other shapes.

It should also be noted that the benefits afforded by the downstream structure are not uniquely realized by the presently described process chamber with inner support. Conventional chambers without a central support plate may also incorporate the downstream structure to some advantage. These advantages will be clear to one of skill in the art for various chamber configuration from the following discussion referencing schematic representations of process chambers.

One general embodiment of the downstream structure within a quartz chamber 388 is schematically illustrated in FIGS. 28a and 28b and comprises a flat plate 390 having a curvilinear front edge 392 adjacent and conforming to the circumference of a susceptor 394. As will be apparent, this plate 390 may represent that portion of the top plate 382 of the ring 380 downstream of the susceptor 394, or may be a separate structure. If the plate 390 comprises a portion of the top plate 382 it is supported by the fingers depending from the chamber inner support plate previously described. If the plate 390 is separate from the ring 380, it may also be suspended from fingers attached to the chamber inner support plate, or may alternatively be supported by a stand, preferably quartz, attached to or positioned within the chamber 388. The plate 390 is preferably constructed of graphite which absorbs the energy radiated from outer heat lamps 396 faster than the quartz chamber 388.

Figure 29A:
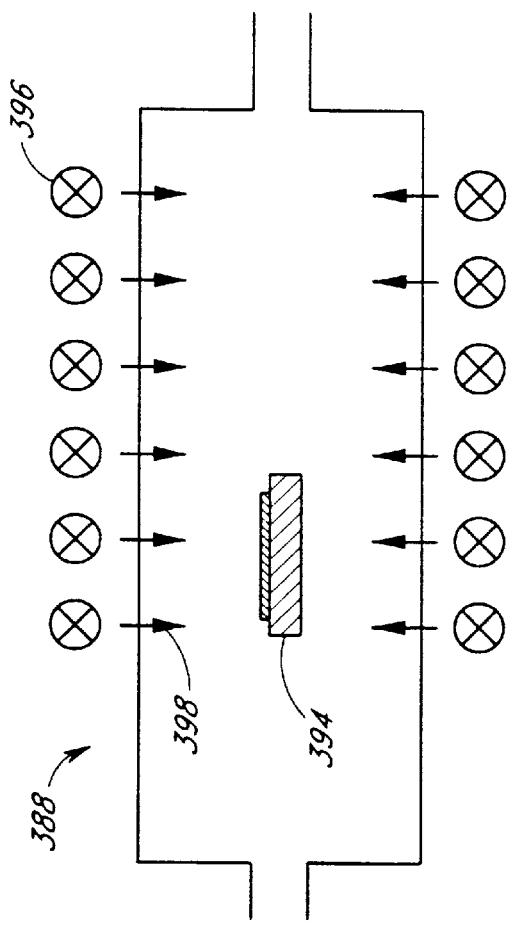
FIG. 29a is a schematic vertical cross-section of a process chamber without the downstream structure showing radiant heat flow from exterior lamps.
Figure 29B:
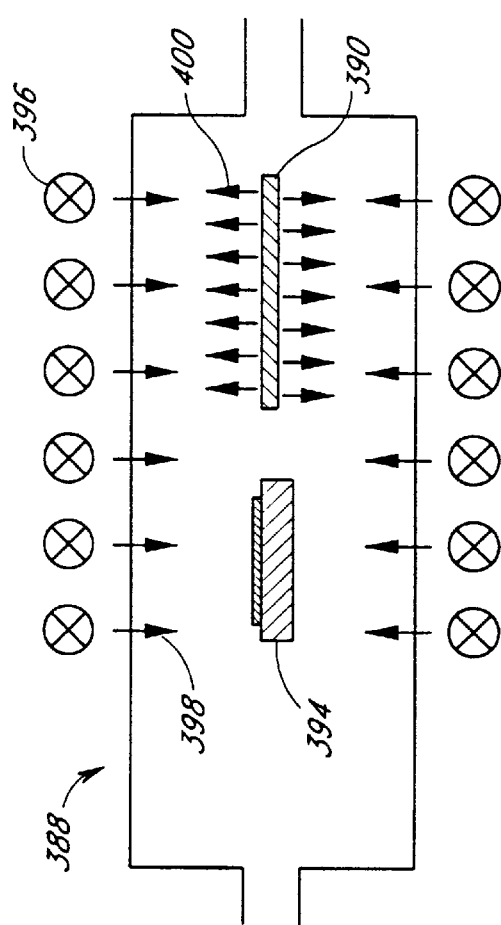
FIG. 29b is similar to FIG. 29a with the downstream structure added showing the change in radiant heat flow within the chamber.

There are several advantages of the downstream structure of the present invention. FIG. 29a shows the process chamber 388 without the downstream plate 390 and schematically shows radiant heat flow 398 from the outer lamps 396. The quartz walls of the chamber 388 are relatively transparent to this energy flow, and thus do not retain a substantial amount of heat. In etching processes, however, it is desirable to heat the chamber walls while etchant gas flow is introduced into the chamber to clean the walls of unwanted particulate buildup. Without the downstream structure, therefore, the walls of the reaction chambers heat up slowly and to a relatively low temperature. As illustrated in FIG. 29b, with the downstream plate 390 in the chamber 388, the reradiated energy (indicated with arrows 400) from the graphite plate is in a frequency range readily absorbed by the quartz reactor walls. The chamber walls can thus be rapidly heated to a high temperature which speeds up the etching cycle and improves overall throughput.

Figure 30B:
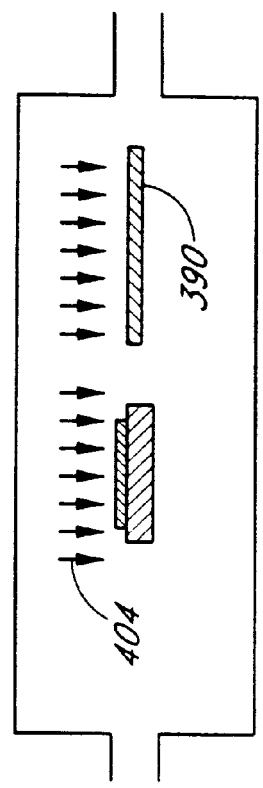
FIG. 30b is similar to FIG. 30a with the downstream structure added showing the change in temperature distribution across a wafer to be processed.
Figure 30A:
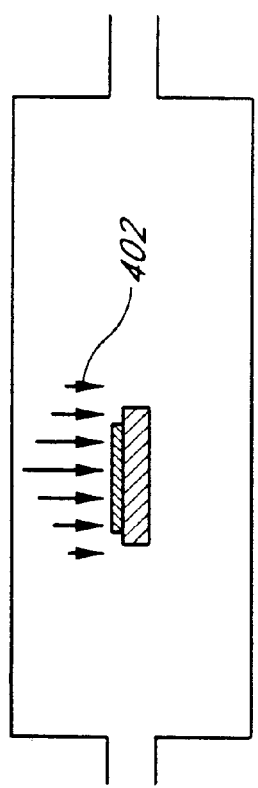
FIG. 30a is a schematic horizontal cross-section of a process chamber without the downstream structure with arrows illustrating a typical temperature distribution across a wafer to be processed.

Arrows 402 in FIG. 30a represent an exaggerated non-uniform chemical vapor deposition on a wafer. Such non-uniformity can result from steep temperature and flow gradients at the edge of the wafer/susceptor. As depicted by arrows 404 in FIG. 30b, the presence of the plate 390 helps even out the temperature and flow gradients at the rear edge of the wafer resulting in a more uniform chemical vapor deposition.

Figure 31B:
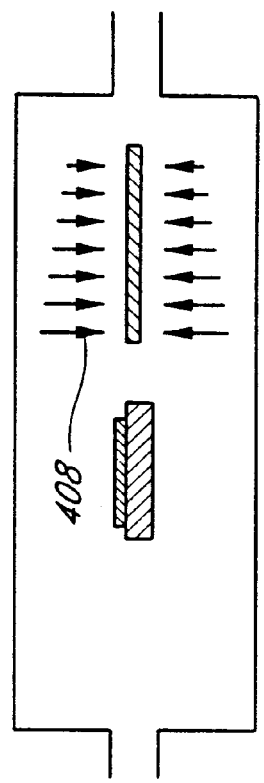
FIG. 31b is similar to FIG. 31a with the downstream structure added showing the change in deposition areas.
Figure 31A:
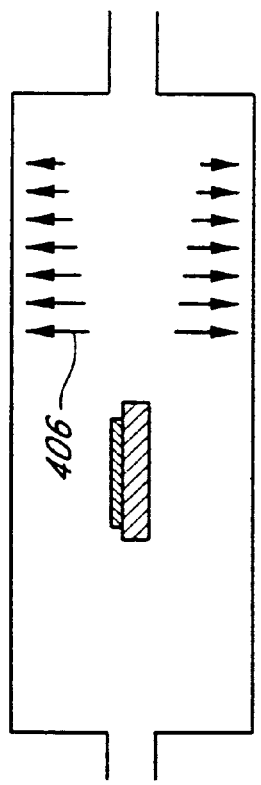
FIG. 31a is a schematic horizontal cross-section of a process chamber without the downstream structure showing typical deposition areas within the chamber.

In FIG. 31a, the walls of the quartz process chamber 388 without the downstream structure, by virtue of their elevated temperature, accumulate a significant amount of unwanted deposition from repeated processing. A typical distribution of this deposition is schematically indicated by the arrows 406. In contrast, as shown in FIG. 31b, the graphite plate 390 becomes the hottest structure within the chamber 388 in the downstream region, and deposition occurs thereon rather than on the chamber walls, as indicated with the arrows 408.

Figure 33A:
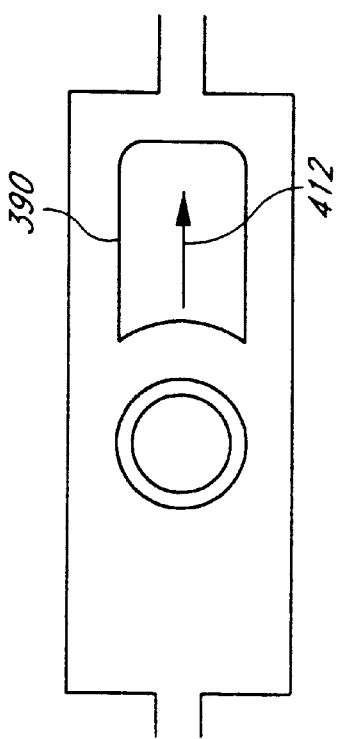
FIGS. 33a and 33b are horizontal and vertical schematic views, respectively, similar to FIGS. 32a,b with the downstream structure added showing the change in gas flow therethrough.
Figure 33B:
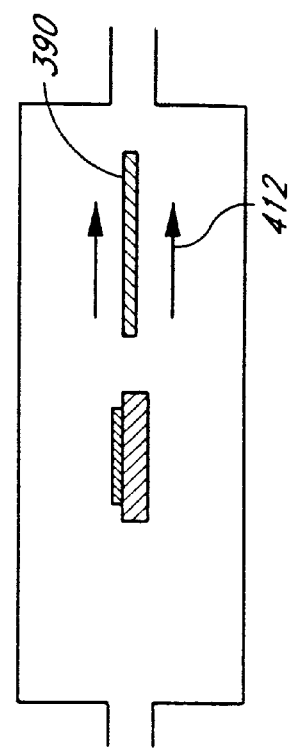
Figure 32A:
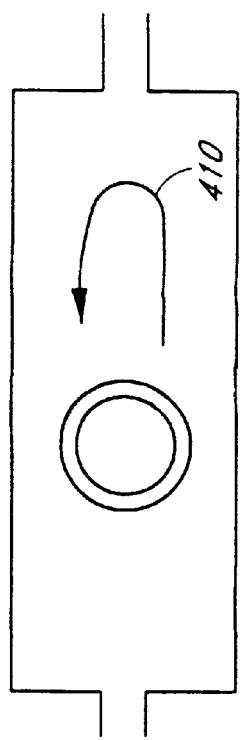
FIGS. 32a and 32b are horizontal and vertical schematic views, respectively, of a process chamber without downstream structure illustrating potential gas recirculations therein.
Figure 32B:
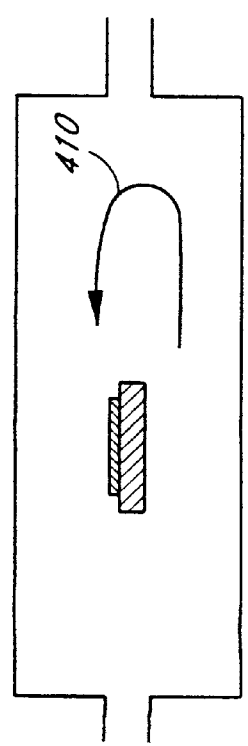

Another benefit of the downstream plate 390 is its tendency to reduce recirculations within the process chamber 388 which can result in unwanted deposition around or even upstream of the wafer/susceptor combination. Such recirculations 410 in a chamber without the downstream structure are shown in FIGS. 32a and 32b. FIGS. 33a and 33b, with the downstream plate 390, show flow lines 412 in a generally continuous left-to-right direction, thus substantially eliminating recirculations.

The downstream structure shown and described above may also be useful in process chambers other than the lenticular chamber with inner support. For example, FIG. 34 illustrates a process chamber 400 having an entry region 402 and an exit region 404, the two regions being rectangular in cross-section. The entry region 402 is defined by a horizontal upper wall 406 and a horizontal first lower wall 408 terminating at a vertical step 410. The step 410 forms the beginning of a second lower wall 412 of the exit region 404 which shares the upper wall 406 with the entry region 402. The chamber 400 thus has a cross-sectional area which approximately doubles at the step 410. A susceptor 414 is supported by a rotary shaft 416 just downstream of the step 410 and in a plane approximately level with the first lower wall 408. A temperature compensation ring 418 supported by a ring-like stand 420 above the second lower wall 412 closely surrounds the susceptor, as previously described. The stand 420 may be as shown and described in U.S. Pat. No. 4,821,674.

A plate 422 is positioned downstream from the ring 418 and may be supported on a stand on the second lower wall 412, or by pins or dowels 424 supported by the side walls of the chamber 400. As seen, the plate 422 is approximately in the plane of the ring 418, susceptor 414, and wafer supported thereon, and extends from the ring to close to the chamber outlet. Upper and lower banks 426a, 426b of lamps direct radiant energy into the chamber and are arranged substantially above and below the area stretching from the leading edge of the ring 418 to the trailing edge of plate 422. The gas flow through the chamber is indicated with the arrow 428. The downstream plate 422 is preferably constructed of graphite to realize the aforementioned benefits of more efficient chamber etch and better temperature uniformity over the wafer. The plate 422 may also be quartz which will not affect the temperature distribution within the chamber significantly, but will enhance flow characteristics and reduce recirculations.

FIG. 35 shows the same chamber 400 with a modified temperature compensation ring 432 surrounding the susceptor 414. The ring 432 comprises a lower annular U-shaped member 434 topped by a planar member 436 which has a width around the susceptor approximately equal to the U-shaped member, but which extends substantially downstream into the exit region 404. The ring 432 is in many respects similar to the ring 380 shown in FIG. 27. In contrast to the previous ring 380, which was supported by fingers attached to the inner support plate 384, the ring 432 is partially supported by the stand 420 and partially by a downstream strut 438. Of course, there are many ways to position the ring 432 in the chamber, the preferred means including some type of quartz structure which can be easily replaced after it deteriorates from repeated process cycles. Again, the ring 432 is desirably constructed of a material with a high thermal mass to help maintain temperature uniformity over the wafer and to enhance the etch cycle effectiveness.

FIGS. 36–38 illustrate a chamber 440, similar to that shown in FIG. 11, along with the associated processing components, such as susceptor 442 for supporting a wafer, gas injector 444 and radiant lamps 446. The chamber 440 includes a central support plate 448 defining upper and lower chamber regions 452, 454, respectively. An inlet end flange 450 has an upper slot 456 leading from a reactant gas input slot 458 in the gas injector 444 into the upper chamber region 452, and a lower slot 460 leading from purge gas apertures 462 in the gas injector into the lower chamber region 454. These features are similar to those described previously.

A gas flow shaping duct 464 is provided in the chamber 440 for channeling gas from the injector 444 toward the susceptor 442. In the embodiment shown, the duct 464 is an inverted U-shape with a rectangular top wall 466 supported on two rectangular side walls 468. The duct 464 defines a channel within which the gas from the injector 444 flows toward the susceptor 442 and wafer thereon. The duct 464 is positioned above the support plate 450 upstream from an edge 470 of the plate facing the susceptor 442.

The height and width of the duct 464 is such that it fits within the upper slot 456 into proximity, but preferably not in contact, with the injector 444. The duct 464 extends approximately ½ to ⅔ of the way from the flange 450 to the edge 470, and is desirably between about 3–5 inches in length, with a range of between 3.7 and 4.5 inches being preferred. The duct 464 desirably is made of quartz and has a thickness of about 0.06 inch. The lateral width is greater than the injector slot 458 width, and is preferably about 9 inches (although larger dimensions will be necessary for chambers adapted to process larger wafers, such as 300 mm wafers). The height of the duct 464 is about 0.9 inches, or between the height of the slot 458 and that of the flange slot 456. The duct 464 is preferably installed and removed from within the chamber through the flange slot 456, which necessitates removal of the injector 44

The presence of the 464 duct confines the flow of gas from the injector 444 from expanding within the chamber 440 for a certain distance into the upper region 452 to improve control of the gas profile and increase the overall gas velocity over the wafer. More specifically, the gas injector 444 creates a particular gas velocity profile by adjustment of flow control valves 472, as previously described, which profile can be diffused from expansion and recirculation within the chamber 440. This is particularly true for atmospheric as opposed to vacuum processes. Additionally, while the velocity of the gas can be suitably maintained from the injector 444 to the susceptor 442 in low pressure processes, it tends to slow down in atmospheric processes. Consequently, the duct 464 maintains the integrity of the velocity profile downstream, which is desirable for all processes, and delays expansion and slowing of the gas flow which primarily benefits higher pressure processes.

The top wall 466 of the duct 464 shown in FIGS. 36–38 has a straight downstream edge 474 and parallel side walls 468. This configuration channels the gas flow generated by the injector 444 without significance disturbance until it emerges from the duct 464 in a plane just upstream of the susceptor 442. The gas then expands slightly toward the chamber walls from not being confined by the walls of the duct 464. Variations on the shape of the duct 464, and on the shape of the outlet edge can be used to direct and shape the gas flow further. Such variations are shown in FIG. 38b–f.

Figure 38A:
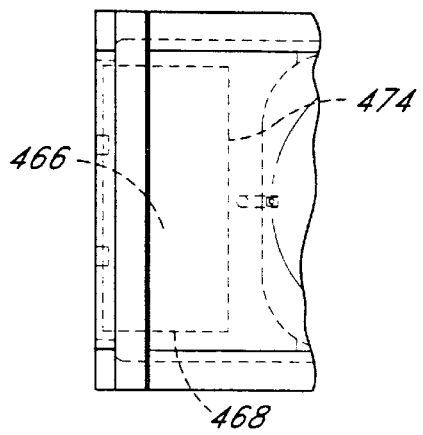
FIG. 38a is a top view of the chamber and flow control channel of FIG. 36.
Figure 38B:
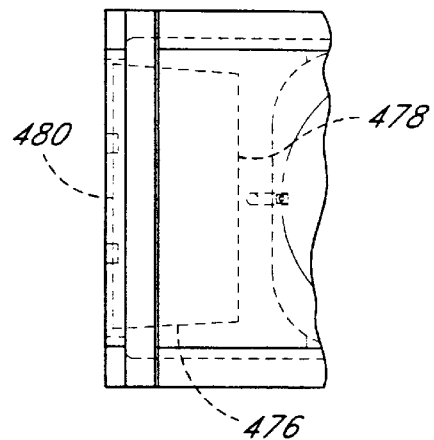
FIGS. 38b–c are top views of the chamber of FIG. 36 showing various flow control channels.

FIG. 38b shows a duct with side walls 476 which taper inward in the direction of gas flow. The top wall thus has a downstream edge 478 smaller than an upstream edge 480. This converging channel configuration focusses the gas flow inward so that the subsequent expansion toward the chamber walls after leaving the confines of the duct is delayed.

Figure 38C:
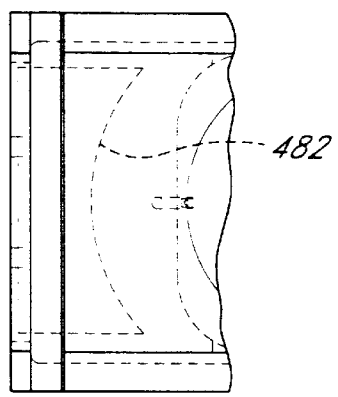

FIG. 38c illustrates a downstream edge 482 which is concave as seen from the susceptor 442. As it passes the downstream edge, the gas flow can expand in the middle portion first thus allowing some inward diffusion of the flow, and increasing the flow in the middle.

Figure 38D:
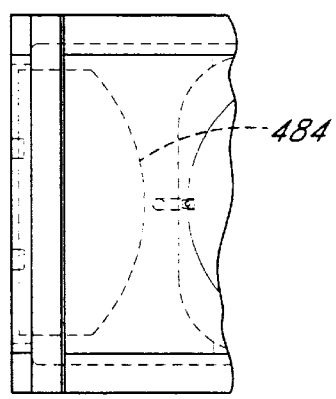

FIG. 38d illustrates a downstream edge 484 which is convex as seen from the susceptor 442. As it passes the downstream edge, the gas flow can expand in the outer portions first, thus allowing some outward diffusion of the flow, and decreasing the flow in the middle.

Figure 38E:
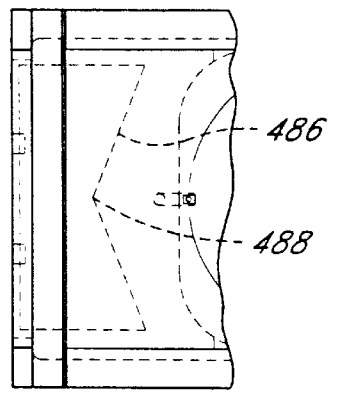

FIG. 38e illustrates a downstream edge with angled portions 486 terminating in a corner 488. The side edges of the duct extend farther than the center of the top wall thus inducing a similar gas flow effect as the concave version of FIG. 38c, with an increased flow through the middle of the chamber.

Figure 38F:
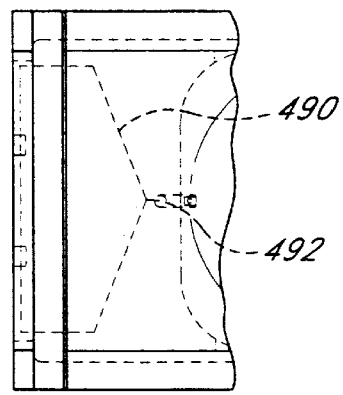

Finally, FIG. 38f illustrates a downstream edge with angled portions 490 terminating in an apex 492. The side edges of the duct terminate before the center of the top wall thus inducing a similar gas flow effect as the convex version of FIG. 38d, with a decreased flow through the middle of the chamber.

Although the present chamber is particularly suited for chemical vapor deposition, other processes requiring clean ovens may benefit from the improved chamber. For example, annealing, etching, plasma-enhanced deposition, and other such processes may all utilize the present chamber in its essential form with appropriate modifications.

Although this invention has been described in terms of certain preferred embodiments, other embodiments that are apparent to those of ordinary skill in the art are also within the scope of this invention. Accordingly, the scope of the invention is intended to be defined by the claims that follow.

What is claimed is:

1. An apparatus for chemical vapor deposition, comprising:
   quartz walls defining a deposition chamber having a deposition gas inlet at an upstream end and a gas outlet on a downstream end, with the chamber walls defining a generally horizontal gas flow passage;
   a susceptor positioned in the chamber passage between the gas inlet and the gas outlet for horizontally supporting a thin flat semiconductor substrate for vapor deposition purposes; and
   a horizontally oriented, thin, flat element positioned in said chamber generally horizontal passage, said element extending laterally, downstream of, and generally parallel to the substrate to be supported on the susceptor and extending across the chamber passage about the width of the susceptor, the susceptor and said element being positioned so that deposition gas flows generally horizontally across the surface of the substrate and said element, said chamber walls above the element being generally transparent to radiation energy, and said element being a good absorber of radiant energy whereby radiation through the chamber walls above the element keeps the element hotter than the walls above the element to cause unused deposition gases to deposit on the element more readily than on the chamber walls, and wherein deposition gas is only introduced into the chamber upstream from said susceptor.

2. The apparatus of claim 1, further comprising a ring surrounding the susceptor, wherein an upstream edge of the element generally conforms to the shape of a downstream edge of the ring.

3. The apparatus of claim 1, wherein the vertical height of said chamber is greater downstream from the susceptor than it is upstream from the susceptor, and said element is positioned substantially horizontally aligned with the susceptor.

4. The apparatus of claim 1, wherein said element extends approximately to said outlet.

5. The apparatus of claim 1, including radiant heating lamps exterior of said chamber and extending above said element, to heat the element.

6. The apparatus of claim 1, wherein said chamber walls define a generally horizontally oriented chamber wherein the deposition gas flows generally horizontally over the surface of the substrate, and radiant heating lamps positioned exterior of the chamber extend over said susceptor and over a portion of the chamber extending between the susceptor and the outlet.

7. A method of making a vapor deposition apparatus comprising:

providing a quartz deposition chamber having a gas flow inlet and a gas flow outlet;

providing a susceptor positioned within the chamber between the inlet and the outlet for horizontally supporting a substrate, with the chamber walls being configured so that deposition gases flow generally horizontally across the upper surface of the substrate, and unused deposition gases flow to said outlet, with no deposition gas from outside the chamber being introduced downstream from the susceptor;

providing radiant heating lamps above the chamber; and positioning a thin, flat plate in the chamber between the susceptor and the chamber gas outlet, with the plate extending generally parallel to the substrate to be positioned on the susceptor, said plate being formed of a material which efficiently absorbs radiant energy transmitted through the chamber walls from said lamps at a much greater extent than the walls of the chamber above the plate, whereby unused deposition gases flowing past the susceptor are much more readily deposited on the heated plate than on the cooler chamber walls.

8. The method of claim 7 including providing a temperature compensation ring surrounding the susceptor, with a prtion of the ring positioned between the susceptor and the plate.

* * * * *

UNITED STATES PATENT AND TRADEMARK OFFICE
CERTIFICATE OF CORRECTION

PATENT NO.     : 6,464,792 B1
DATED          : October 15, 2002
INVENTOR(S)    : John F. Wengert et al.

It is certified that error appears in the above-identified patent and that said Letters Patent is hereby corrected as shown below:

<u>Title page,</u>
Item [75], Inventors, please delete "Loren R. Jacobs, Mesa; Michael W. Halpin, Phoenix; Derrick W. Foster, Scottsdale;" "Robert M. Vyne, both of Tempe; Mark R. Hawkins, Gilbert" and replace with only the remaining two inventors:
-- John F. Wengert, Phoenix, AZ; Cornelius A. van der Jeugd, Tempe, AZ --

Signed and Sealed this

Ninth Day of December, 2003

JAMES E. ROGAN
*Director of the United States Patent and Trademark Office*